United States Patent
Fritzemeier et al.

(12) 
(10) Patent No.: US 6,562,761 B1
(45) Date of Patent: May 13, 2003

(54) COATED CONDUCTOR THICK FILM PRECURSOR

(75) Inventors: Leslie G. Fritzemeier, Mendon, MA (US); Christopher A. Craven, Bedford, MA (US); Cornelis Leo Hans Thieme, Westborough, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/500,717

(22) Filed: Feb. 9, 2000

(51) Int. Cl.$^7$ .................. C01F 11/00; C04B 35/553; H01B 12/00

(52) U.S. Cl. .................. 505/510; 501/123; 501/126

(58) Field of Search .................. 505/510; 501/123, 501/126, 152

(56) References Cited

U.S. PATENT DOCUMENTS

| | | | |
|---|---|---|---|
| 3,985,281 A | 10/1976 | Diepers et al. | 228/148 |
| 4,859,652 A * | 8/1989 | Block | 505/1 |
| 4,956,340 A * | 9/1990 | Kimura et al. | 505/1 |
| 4,959,347 A * | 9/1990 | Kobayashi et al. | 505/1 |
| 4,994,433 A | 2/1991 | Chiang | 505/1 |
| 5,038,127 A | 8/1991 | Dersch | 335/216 |
| 5,071,823 A | 12/1991 | Greuter et al. | 505/1 |
| 5,073,537 A | 12/1991 | Hung et al. | 505/1 |
| 5,231,074 A | 7/1993 | Cima et al. | |
| 5,236,890 A * | 8/1993 | Murakami et al. | 505/1 |
| 5,304,533 A * | 4/1994 | Kobayashi et al. | 505/440 |
| 5,449,659 A | 9/1995 | Garrison et al. | 505/330 |
| 5,484,766 A * | 1/1996 | Shah et al. | 505/441 |
| 5,741,377 A | 4/1998 | Goyal et al. | 148/512 |
| 5,866,252 A | 2/1999 | de Rochemont et al. | 428/373 |
| 5,968,877 A | 10/1999 | Budai et al. | 505/237 |
| 5,981,445 A * | 11/1999 | Kirchnerova et al. | 505/440 |
| 6,027,564 A | 2/2000 | Fritzemeier et al. | |

FOREIGN PATENT DOCUMENTS

| | | |
|---|---|---|
| EP | WO 308 869 A2 | 3/1989 |
| EP | 0 387 525 A1 | 9/1990 |
| EP | WO 431 782 A1 | 6/1991 |
| EP | WO 506582 | 9/1992 |
| EP | 0 584 410 A1 | 3/1994 |
| EP | 0 872 579 A1 | 10/1998 |
| WO | WO 92/05591 | 4/1992 |
| WO | WO 97/05669 | 2/1997 |
| WO | WO 98/58415 | 12/1998 |
| WO | WO 99/16941 | 4/1999 |
| WO | WO 99/17307 | 4/1999 |
| WO | WO 99/25908 | 5/1999 |
| WO | WO 99/35083 | 7/1999 |

OTHER PUBLICATIONS

Moore et al. "Sol–gel processing of yttrium barium copper oxide . . . ", Mater. Lett. (1989), 7(12), 415–24. Abstract Only, 1989.*

U.S. patent application Ser. No. 09/617,520, Lu et al., filed Jul. 14, 2000.

U.S. patent application Ser. No. 09/616,570, Fritzemeier et al., filed Jul. 14, 2000.

U.S. patent application Ser. No. 09/500,718, Malozemoff et al., filed Feb. 09, 2000.

(List continued on next page.)

*Primary Examiner*—Mark Kopec
(74) *Attorney, Agent, or Firm*—Fish & Richardson P.C.

(57) ABSTRACT

Methods for preparing thick film rare-earth $Ba_2Cu_3O_{7-\delta}$ (such as YBCO) superconductive layers, particularly including deposition of a precursor as a dispersion of solid-state materials, including a binder or a solvent or both constituents. The solid-state materials include oxides, fluorides, and acetates of yttrium, barium, and copper in the form of ultrafine particles.

37 Claims, 15 Drawing Sheets

OTHER PUBLICATIONS

U.S. patent application Ser. No. 09/616,566, Zhang et al., filed Jul. 14, 2000.

U.S. patent application Ser. No. 09/615,669, Buczek et al., filed Jul. 14, 2000.

U.S. patent application Ser. No. 09/617,518, Fritzemeier, filed Jul. 14, 2000.

U.S. patent application Ser. No. 09/500,701, Buczek et al., filed Feb. 09, 2000.

U.S. patent application Ser. No. 09/579,193, Malozemoff et al., filed May 26, 2000.

Apicella et al., "The Effects of Surface Contamination On The Biaxially Textured Substrate For YBCO Thick Film Deposition", International Journal of Modern Physics B, vol. 13, Nos. 9 & 10 (1999) pp 997–1004.

He et al., "Deposition of biaxilaly–oriented metal and oxide buffer–layer films on textured Ni tapes: new substrates for high–current, high–temperature superconductors", Physica C, 275 (1997) 155–161.

McIntyre et al, "Epitaxial nucleation and growth of chemically derived $Ba_2Ycu_3O^{7-x}$ thin films on (001) $SrTiO_3$", Journal of Applied Physics, 77 May 15, 1995, No. 10, pp 5263–5272.

Boffa et al., "Laser–ablation deposition of $CeO_2$ thin films on biaxially textured nickel substrates", Physica C 312 (1999) 202–212.

He et al., "Growth of biaxially oriented conductive $LaNiO_3$ buffer layers on textured Ni tapes for high–τc–coated conductors", Physica C 314 (1999) 105–111.

Sheth et al., "Bench Scale Evaluation of Batch Mode Dip–Coating of Sol–Gel $LaAIO_3$ Buffer Material", IEEE Transactions on Applied Superconductivity, vol. 9, No. 2, Jun. 1999, pp 1514–1518.

Tanaka et al., "Improvement of $YBA_2Cu_3O_x$ Single–Crystal Surface by Chemical Etching", Jpn. J. App. Phys. vol. 38 (1999) pp L731–L733, Part 2, No. 7A, Jul. 1, 1999.

Koster et al., "flInfluence of the surface treatment on the homoepitaxial growth of $SrTioO_3$", Materials Science and Engineering B56 (1998) 209–212.

McIntyre et al., "Effect of growth conditions on the properties and morphology of chemically derived epitaxial thin films of $Ba_2Ycu_3O_{7-x}$ on (001) $LaAIO_3$", J. Appl. Phys. 71 (4), Feb. 15, 1992, pp 1868–1877.

"Fabrication of High Temperature Superconducting Films Using Perfluoro–Organometallic Precursors", IMB Technical Disclosure Bulletin, vol. 32, No. 5B, Oct. 1989, p 241.

Smith, J.A et al., "High Critical Current Density Thick MOD–Derived YBCO Films," Transactions on Applied Superconductivity, vol. 9, No. 2, Jun. 1999.

Beach et al., "Sol–Gel Synthesis of Rare Earth Aluminate Films as Buffer Layers for High Te Superconducting Films," Mat. Res. Soc. Symp. Proc., vol. 495, 293 (1988).

Lee et al., "Alternative Buffer Architectures for High Critical Current Density YBCO Superconducting Deposits on Rolling Assisted Biaxially–Textured Substrates," Japanese J. Appl. Phys., vol. 38, L178 (1999).

Paranthaman et al., "Growth of Biaxially Textured $RE_2O_3$ Buffer Layers on Rolled–Ni Substrates Using Reactive Evaporation for HTS–Coated Conductors," Superconductor Sci. Tech., vol. 12, 319 (1999).

Rupich et al., "Growth and Characterization of Oxide Buffer Layers for YBCO Coated Conductors," IEEE Trans. on Appl. Superconductivity, vol. 9 (1999).

Shoup et al., "Epitaxial Thin Film Growth of Lanthanum and Neodymium Aluminate Films on Roll–Textured Nickel Using a Sol–Gel Method," J. Am. Cer. Soc., vol. 81, 3019 (1998).

"Silicon Processing for the VLSI Era," vol. 1, eds. S. Wolf and R.N. Tanber, Lattice Press, Sunset Park, CA, pp. 539–574 (1986).

* cited by examiner

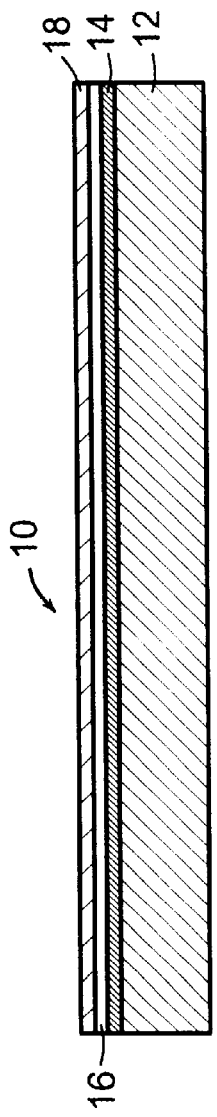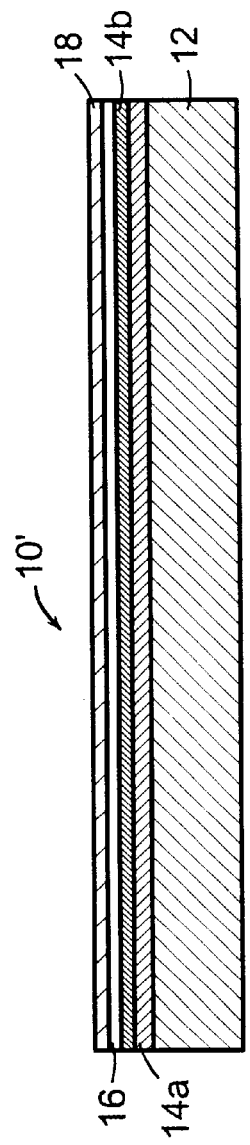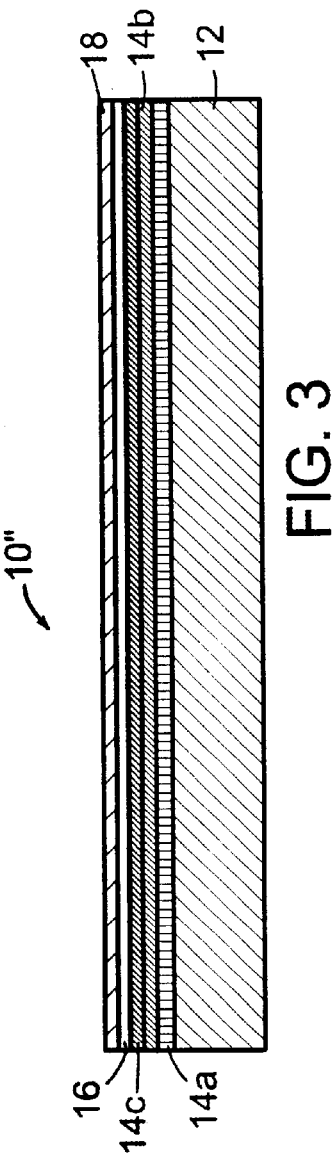

COATED CONDUCTOR THICK FILM PRECURSOR

The Government has rights in this invention pursuant to Contract Number F33615-99-C-2968, awarded by the U.S. Department of Defense.

TECHNICAL FIELD

This invention relates to high temperature superconductors (HTS), and more particularly to superconducting layers and methods of depositing precursor compositions for such layers.

BACKGROUND

Coated conductors, comprising a single or multiple combinations of a biaxially textured high temperature superconductor ("HTS") layer on a thin buffer layer and a substrate tape, are a cost-performance-effective technology for manufacturing long length flexible HTS wire for magnet, coil and power applications. For example, these conductors should be useful for power transmission cables, rotor coils of motors and generators, and windings of transformers, as well as for magnets for medical magnetic resonance imaging (MRI), magnetic separation, ion-beam steering and magnetic levitation. Particularly of interest here are applications which use ac currents and fields, or fast ramps of current and field, for example ac power transmission cables, transformers, faultcurrent limiters, magnetic separation magnets and high energy physics magnets.

Some background on biaxially textured high temperature superconducting "coated conductors" is known. Such coated conductors include at least, for example, a substrate and a superconducting layer (such as YBCO) deposited thereon. One or more buffer layers may be included between the substrate and the superconductor material. An advantage of such materials as YBCO ($YBa_2Cu_3O_x$, or Yttrium-Barium-Copper-Oxide) films is the very high critical current densities attainable, particularly in magnetic fields. Other related superconducting materials which can be used are $REBa_2Cu_3O_x$, where the Y has been partially or completely replaced by rare earth elements (RE). As information as to the requirements for commercial application, and limitations on conductor technology has become available, the potential for low production costs of these rare-earth superconducting materials (including YBCO) has also become of interest in further development.

Certain challenges in this field include the need for cost effective methods for producing chemically compatible biaxially textured buffer layers, as well as the need to deposit sufficient thickness of the high critical current density superconducting layer. Regarding the first objective, it appears that deformation textured substrates with epitaxial buffer layers can be made cost effective. In addition ion beam assisted deposition of thin MgO layers with epitaxial top layers may prove to be economically viable.

Regarding the need to deposit thick layers of superconductor precursor compositions, a number of techniques have been evaluated. Chemical vapor deposition (CVD) is not considered a competitive method at this time, due to the very high cost of precursor materials. Most physical vapor deposition (PVD) methods, (for example, pulsed laser ablation, reactive sputtering and electron beam evaporation) are limited by deposition rate, compositional control, and high capital costs. A possible economical PVD method would be thermal or electron beam evaporation of the rare earth elements, copper and barium fluoride, known as the "barium fluoride" process. This process appears to be more rapid than direct PVD methods, but capital costs and control system costs are still likely to be too high. Additionally, the deposited precursor composition must subsequently be reacted in a separate furnace system to form the HTS film.

Solution deposition methods have been evaluated, and these appear to offer much lower costs, since vacuum systems are eliminated. Thus, capital costs are not as high, and deposition rates not as low, as other methods using vacuum systems. Trifluoroacetate (TFA) solution processes offer low costs for precursor compositions, high deposition rate, and non-vacuum processing advantages. Such processes are described, for example, in U.S. Pat. No. 5,231,074 to Cima et al., and PCT Publication No. WO 98/58415, published Dec. 23, 1998 and require dissolution of the constituents of the precursor composition to form a solution phase. Both U.S. Pat. No. 5,231,074 and PCT Publication No. WO 98/58415 are hereby incorporated by reference in their entirety.

For commercial processes, it is desirable to have a composition serving as a precursor to superconducting films, which can be coated onto large area substrates in a single application using high-deposition rate, to produce a desired film thickness. The precursor composition is preferably convertible to the superconducting phase by way of simple thermal processes.

SUMMARY

The invention provides a low cost method for fabricating thick film precursor compositions of rare-earth superconductors on long lengths of substrate. The final thicknesses of such films are preferably between about 1 micron and about 5 microns. The specific superconductors of interest are high temperature superconductors of the class of rare-earth barium cuprate species (REBCO), including, for example, $YBa_2Cu_3O_{6.8}$ (YBCO), or systems based on thallium/barium/calcium/copper/oxide (ThBCCO) or bismuth/strontium/calcium/copper/oxide (BSCCO), and other known superconducting materials, including versions doped with other species. Of particular interest are those materials having superconducting transition temperatures, $T_c$, above about 77 K. The most useful buffered substrates for such films are biaxially textured, providing an epitaxial growth template for achieving maximum attainable critical current densities ($J_c$). The precursor compositions for the superconducting layer of such high temperature superconductors include solid-state, or semi solid-state precursors deposited in the form of a dispersion. These precursor compositions allow for example the substantial elimination of in the case of YBCO $BaCO_3$ formation in final YBCO superconducting layers, while also allowing control of film nucleation and growth.

As used herein, "biaxially textured" refers to a surface for which the crystal grains are in close alignment with a direction in the plane of the surface. One type of biaxially textured surface is a cube textured surface, in which the crystal grains are also in close alignment with a direction perpendicular to the surface. Examples of cube textured surfaces include the (100)[001] and (100)[011] surfaces, and an example of a biaxially textured surface is the (113)[211] surface. As used herein, "epitaxial layer" refers to a layer of material, the crystallographic orientation of which is directly related to the crystallographic orientation of the surface of a layer of material onto which the epitaxial layer is deposited. For example, for a multi-layer superconductor having an epitaxial layer of superconductor material deposited onto a substrate, the crystallographic orientation of the layer of superconductor material is directly related to the crystallographic orientation of the substrate. Thus, in addition to the above-discussed properties of a substrate, it can also be desirable for a substrate to have a biaxially textured surface or a cube textured surface.

As used herein, a "dispersion" is a two-phase system in which one phase includes finely divided particles distributed throughout a liquid second phase. As used herein, "ultrafine particles" are those particles sufficiently small to allow a uniform distribution of cation elements within the precursor composition, and a chemically homogeneous superconducting film. For a superconducting film of from about 1 to about 10 microns thickness, the particle diameters are typically less than about 10% of the final film thickness. In addition, the particle sizes are small enough, and uniformly distributed enough, to allow rapid local diffusion of cationic constituents of the precursor compositions, for the efficient formation of substantially stoichiometric superconducting layers. As used herein, "substantially stoichiometric" refers to the elemental ratios in mixtures of materials, in which the atomic ratios of cationic elements are within about 10% of whole number values. Such deviations from whole number stoichiometries can be deliberately introduced or can arise from the supply of materials, and can be desirable to aid in material processing. Experiments can show that excess elements are typically rejected by the material as a whole, resulting in nearly stoichiometric amounts of the elements.

The invention allows the deposition of thick films in a single deposition step. Although multiple deposition steps can be carried out according to the particular application, each of said steps can give a film thicker than that available from previously known solution processes. Simplified binder removal or decomposition may significantly improve the prospect of a low cost superconductor preparation method.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

BRIEF DESCRIPTION OF DRAWINGS

FIGS. 1–3 are alternate configurations for high temperature superconductor coated conductors.

DETAILED DESCRIPTION

Figure 4:
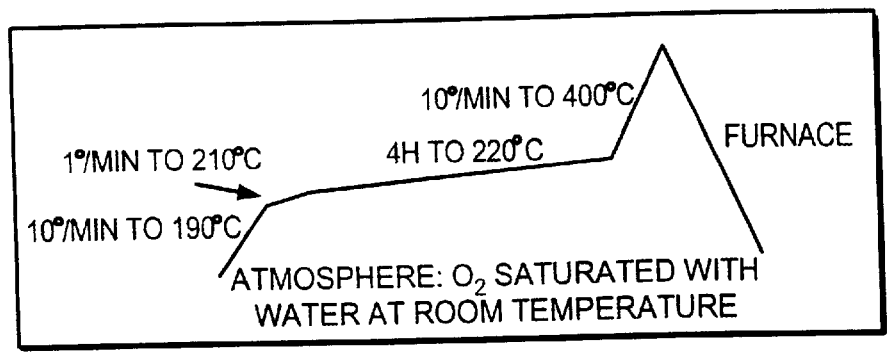
FIGS. 4–6 are furnace profile diagrams used for decomposition of samples according to particular embodiments of the invention.

The invention results from the discovery that relatively high critical current densities can be achieved in high temperature superconductors (HTS) from precursor compositions containing solid-state constituents. Such methods combine the advantages of the use of a $BaF_2$-Containing precursor composition with an easily practiced deposition method for creating thick films.

The invention includes precursor compositions, and methods for depositing precursor compositions of superconducting material on substrates, either directly onto the substrate, or onto a buffer- and/or intermediate-coated substrate, thereby forming biaxially textured superconducting oxide films from the precursor compositions. The precursor compositions comprise solid-state constituent-containing components.

Referring to FIGS. 1–3, various embodiments for HTS coated conductors are shown. Referring to FIG. 1, high temperature superconductor (HTS) articles such as 10, particularly in the form of wires or tapes, generally comprise a substrate 12, at least one buffer coating 14, a superconducting layer 16 (formed of, for example, YBC, REBC), and a cap layer 18. Any of the embodiments can further include a cap layer 18. Cap layer 18 can be formed of one or more layers, and preferably includes at least one noble metal layer. "Noble metal," as used herein, is a metal, the reaction products of which are thermodynamically unstable under the reaction conditions employed to prepare the HTS tape. Exemplary noble metals include, for example, silver, gold, palladium, and platinum. Noble metals provide a low interfacial resistance between the HTS layer and the cap layer. In addition, cap layer 18 can include a second layer of normal metal (for example, copper or aluminum or alloys of normal metals.

A structure 10' having two buffer layers is shown in FIG. 2 where the substrate 12 is covered with a layer 14a and subsequently a second layer 14b. A cap material 18 can also be added. The multiple layers 14a and 14b can include any combination of layers, such as a metal layer 14a with an oxide layer 14b on top, or an oxide layer 14a with another oxide layer 14b on top. Alternatively, referring to FIG. 3, three buffer layers can be utilized. In this arrangement, structure 10" includes substrate 12 coated with a metal or oxide layer 14a which in turn is coated with additional metal or oxide layers 14b and 14c before deposition of the superconducting layer 16. A cap material 18 can also be added.

The overall buffer layer (14a, 14b and 14c) can have a total thickness of from about 0.1 to about 1.0 micrometers, and preferably from about 0.1 to 0.5 micrometers, or more preferably from about 0.1 to 0.2 micrometers.

Alternative coated conductor configurations are described in U.S. application Ser. No. 60/145,468, filed Jul. 23, 1999, entitled "Enhanced High Temperature Coated Superconductor", and U.S. application Ser. No. 09/500,718, filed Feb. 9,2000, entitled "Coated Conductor with Reduced A.C. Loss"; both of which are hereby incorporated by reference in their entirety.

Substrates for use in superconductors are desirably biaxially textured metallic substrates. Ideally, the substrate can have such biaxial texture imposed by simple thermo-mechanical means. Other preferred properties for substrates are that they are non-ferromagnetic at application temperatures (that is, from below about 125K), electrically conductive, relatively strong at room temperature, and oxidation resistant at elevated temperatures. Nickel and copper can be biaxially textured by rolling deformation, followed by a secondary recrystallization at an elevated temperature. However, these pure metals have the drawbacks that they are either ferromagnetic (Ni), or easily oxidized (Cu).

Substrate alloy materials include those alloys having a cube-textured surface and include a first metal and a second metal different than the fast metal. Alloys for use as substrates are generally described in U.S. patent application Ser. No. 08/942,038, filed Oct. 1, 1997, entitled "Substrates for Superconductors"; U.S. patent application Ser. No. 09/283, 777, filed Mar. 31, 1999, entitled "Alloy Materials;" U.S. patent application Ser. No. 08/943,047, filed Oct. 1, 1997, entitled "Substrates with Improved Oxidation Resistance"; U.S. patent application Ser. No. 09/283,775, filed Mar. 31, 1999, entitled "Alloy Materials"; U.S. patent application Ser. No. 09/616,570, filed Jul. 14, 2000, entitled "Surface Control of Alloy Substrates"; PCT Publication No. WO 99/17307, published on Apr. 8, 1999, or in PCT Publication No. WO 99/16941, published on Apr. 8, 1999, all of which are hereby incorporated by reference.

These include biaxially textured copper-nickel (Cu—Ni) alloys with a face-centered cubic structure, having from about 5 to 45% atomic Ni, and the remainder atomic Cu, with approximately 5% or less atomic aluminum. Other suitable exemplary alloys include nickel-chromium and similar alloys. Substrates can also be those in the form of a single crystal which is matched to the final superconductor, such as (001) $SrTiO_3$, (001) $LaAlO_3$, (001) $LaGa)_3$, and (001) $NdGa)_3$. Other substrates such as non-lattice matched inert substrates (for example, $BaZrO_3$, or barium aluminum spinel, or Ag-coated substrates including silver, ceramics or composites), or lattice matched non-inert substrates can also be used in conjunction with the invention.

In some embodiments, the substrate is an alloy, either Ni-13% Cr, or Cu-45% Ni-1.5% Al, all percentages by weight. The substrate can desirably possess a large surface area, and be formed as a wafer, a web, a tape or a wire.

In some embodiments, a transient layer or intermediate can be used to further control the surface character of biaxially textured alloy substrates. Such transient layers act as intermediate epitaxial films on such substrates, and serve to stabilize the substrate surface against oxidation. This layer can be nickel, gold, silver, palladium, or alloys of these or similar materials, and is deposited on the substrate alloy in a controlled environment under which the oxides of such materials are not thermodynamically stable, thereby maintaining a textured surface for further deposition.

In some embodiments of making an HTS coated conductor, intermediate or transient layers may be used. Intermediate layers suitable for use in the present invention include those epitaxial metal or alloy layers that do not form surface oxides when exposed to conditions as established by $P_{O2}$ and temperature required for the initial growth of epitaxial films (for example, $P_{O2}$ and temperature conditions required for the growth of expitaxial buffer layers). In addition, the intermediate layer acts as a barrier to prevent substrate element(s) from migrating to the surface of the intermediate layer and forming oxides during the initial growth of the epitaxial layer. Absent such an intermediate layer, one or more elements in the substrate might be expected to form thermodynamically stable oxide(s) at the substrate surface which could significantly impede the depositon of epitaxial (for example, buffer) layers due to, for example, lack of texture in this oxide layer.

In some embodiments the intermediate layer is transient in nature. "Transient", as used herein, refers to an intermediate layer that is wholly or partly incorporated into or with the biaxially textured substrate alloy following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property (e.g. the intermediate layer is magnetic, such as Ni).

Exemplary intermediate metal layers include nickel, gold, silver, palladium and alloys thereof. Additional metals or alloys may include alloys of nickel and/or copper. Epitaxial films or layers deposited on an intermediate layer can include metal oxides, chalcogenides, halides and nitrides. These epitaxial layers could be a buffer layer, or layers, which serve as a template for the deposition of functional layers (e.g. superconductor, semiconductor, photovoltaic). Alternatively, the epitaxial layer could be a functional layer itself.

Care should be taken that the deposited intermediate layer is not completely incorporated into or does not completely diffuse into the substrate before the epitaxial (e.g. buffer) layer is deposited to allow for epitaxial nucleation and growth of the initial buffer layer structure. This means that after selecting the metal (or alloy) for proper attributes such as diffusion constant in the substrate alloy, thermodynamic stability against oxidation under practical epitaxial (e.g. buffer) layer growth conditions and lattice matching with the epitaxial (e.g. buffer) layer, the thickness of the deposited metal (or alloy) layer has to be adapted to the epitaxial (e.g. buffer) layer depositon conditions, in particular to temperature. For example, if a CuNiX alloy is used as a substrate alloy (X is an oxide former such as Cr, Al, Mg or the like), Ni as an intermediary metal layer, and 600° C. as an epitaxial buffer layer deposition temperature, the deposited Ni layer needs to be thicker than 0.2 micrometer, preferably 0.5 to 1 micrometer. This is to ensure that the entire intermediate layer is not absorbed by or incorporated with the substrate alloy before the initial epitaxial buffer layer covers the entire surface of the intermediate layer and to ensure that the substrate alloy oxide scale forming element(s) does not reach the deposition surface before the initial epitaxial layer covers the entire surface of the intermediate layer. If CuNi is used as a substrate alloy the Ni needs to be thicker than one micrometer, preferably 2–5 micrometer, as the Ni will also act as an oxygen barrier to avoid oxidation of the CuNi alloy. More generally, conventional diffusivity calculations can be used to determine the time necessary for diffusion of substrate alloy elements to the surface of the intermediate layer, and/or for the intermediate layer to be incorporated into the substrate alloy under the specific temperatures used for epitaxial layer deposition.

Deposition of the intermediate metal layer can be done in a vacuum process such as evaporation or sputtering as in the present invention, or by electro-chemical means such as electroplating (with or without electrodes). These deposited intermediate metal layers may or may not be epitaxial after deposition (depending on the substrate temperature during deposition), but epitaxial orientation can subsequently be obtained during a post-deposition heat treatment. For example 600° C. heat treatment for 1–2 hours has been found to be sufficient to induce texture in evaporated, sputtered and electroplated Ni layers on the cube textured Cu-46% Ni substrates.

Suitable transient layers and methods are discussed in U.S. Provisional Patent Application No. 60/150,465, filed Aug. 24, 1999, entitled "Surface Control of Alloy Substrates" and U.S. Provisional Patent Application No. 60/170,968, filed Dec. 15, 1999, entitled "Surface Control of Alloy Substrates and Methods of Manufacture Therefor", each of which are incorporated herein by reference.

A buffer layer can be introduced on the substrate material, or on the intermediate layer. Examples of buffer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $LaNiO_3$, $LaCuO_3$, $SrRuO_3$, $NdGaO_3$, $NdAlO_3$, and/or nitrides as known to those of skill in the art. A buffer material can be prepared using solution phase techniques, including metal-o-organic deposition, such as disclosed in, for example, S.S. Shoup et al., *J Am. Chem. Soc.* vol. 81, 3019; D. Beach et al., *Mat. Res. Soc. Symp. Proc.*, vol. 495, 263 (1988); M. Paranthaman et al., *Superconductor Sci. Tech.*, vol. 12, 319 (1999); D.J. Lee et al., *Japanese J Appl. Phys.*, vol. 38, L178 (1999); and M.W. Rupich et. al., *I.E.E.E Trans. On Appl. Supercon.*, vol. 9, no. 2, (June, 1999), 1527. Alternatively, vacuum deposition techniques can be used to prepare a buffer layer material.

Examples of vacuum deposition techniques are disclosed in commonly owned U.S. Pat. No. 6,027,564, issued Feb. 22, 2000; U.S. Pat. No. 6,022,832, issued Feb. 8, 2000; U.S. patent application Ser. No. 09/007,372, filed Jan. 15, 1998, entitled "Low Vacuum Vapor Process for Producing Epitaxial Layers of Semiconductor Material"; PCT Publication No. WO 99/15718, published on Apr. 1, 1999, entitled "Low Vacuum Vapor: Process for Producing Epitaxial Layers"; PCT Publication No. WO 99/15719, published on Apr. 1, 1999, entitled "Low Vacuum Vapor Process for Producing Superconductor Articles with Epitaxial Layers;" U.S. patent application Ser. No. 09/007,373, filed Jan. 15, 1998, entitled "Superconductor Articles with Epitaxial Layers"; PCT Publication No. WO 99/15333, published on Apr. 1, 1999, entitled "Superconductor Articles with Epitaxial Layers"; PCT Publication No. WO 99/25908, published May 27, 1999, entitled "Thin Films Having a Rock-Salt-Like Structure Deposited on Amorphous Surfaces"; each of which is hereby incorporated by reference. Alternative buffer layer deposition techniques are disclosed in commonly owned, copending U.S. patent application Ser. No. 09/500,701, filed Feb. 9, 2000, entitled "Oxide Layer Method", incorporated herein by reference.

Methods for conditioning (chemically and/or thermally) buffer layers for maximum chemical compatibility with the superconductor layer are discussed, for example in U.S. Provisional Patent Application Serial No. 60/166,140, filed Nov. 18, 1999, entitled "Multi-Layer Articles and Method of Making Same".

A superconducting layer is deposited on the substrate, intermediate-coated substrate, or buffer-coated substrate, in the form of a precursor composition. Two general approaches are presented for the formulation of precursor compositions. In both approaches, the advantages of the method will be redirected if at least a portion of the components is present in solid form. In one approach, the cationic constituents of the precursor composition are provided in components taking on a solid form, either as elements, or preferably, compounded with other elements. The precursor composition is provided in the form of ultrafine particles which are dispersed so that they can be coated onto and adhere onto the surface of a suitable substrate, intermediate-coated substrate, or buffer-coated substrate. These ultrafine particles can be created by aerosol spray, by evaporation or by similar techniques which can be controlled to provide the chemical compositions and sizes desired. The ultrafine particles are less than about 500 nm, preferably less than about 250 nm, more preferably less than about 100 nm and even more preferably less than about 50 nm. In general, the particles are less than about 50% of the thickness of the desired final film thickness, preferably less than about 30% most preferably less than about 10% of the thickness of the desired final film thickness. Precursors for the preparation of ultrafine particles can be metalorganic solutions such as those disclosed in U.S. Pat. No. 5,231,074 to Cima et al., PCT Publication No. WO 98/58415, published on Dec. 23, 1998, entitled "Controlled Conversion of Metal Oxyfluorides into Superconducting Oxides", each of which is hereby incorporated by reference.

Alternatively, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{6.8}$) or a number of solids, each containing a particular constituent of the desired final superconducting layer (for example, $Y_2O_3$, $BaF_2$, CuO) could be used to produce the ultrafine particles for production of the precursor compositions. Alternatively, spray drying or aerosolization of a metalorganic solution comprising a substantially stoichiometric mixture of desired REBCO constituents could be used to produce the ultrafine particles used in the precursor compositions.

For example, in one embodiment according to this first approach, the precursor composition comprises ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles.

For example, in an alternate embodiment according to this first approach, the precursor composition comprises ultrafine particles of one or more of the constituents of the superconducting layer in a substantially stoichiometric mixture, present in a carrier, the carrier being substantially as described above. Each ultrafine particle contains a substantially compositionally uniform, homogeneous mixture of such constituents. For example, each particle can contain $BaF_2$, and rare-earth oxide, and copper oxide or rare earth/barium/copper oxyfluoride in a substantially stoichiometric mixture. For example, analysis of such particles would reveal a rare-earth:barium:copper ratio as substantially 1:2:3 in stoichiometry, with a fluorine:barium ratio of substantially 2:1 in stoichiometry. These particles can be either crystalline, or amorphous in form.

Alternatively, in a second approach, one or more of the cationic constituents is provided in the precursor composition as a metalorganic salt or metalorganic compound, and is present in solution. The metalorganic solution acts as a solvent, or carrier, for the other solid-state elements or compounds. According to this latter approach, dispersants and/or binders can be substantially eliminated from the precursor composition. For example, in an embodiment according to this second approach, the precursor composition comprises ultrafine particles of rare-earth oxide and copper oxide in substantially a 1:3 stoichiometric ratio, along with a solublized barium-containing salt, for example, barium-trifluoroacetate dissolved in an organic solvent, such as methanol.

The substrate is desirably uniformly coated to yield a superconducting film of from about 1 to about 10 microns, preferably from about 1 to about 5 microns, more preferably from about 2 to about 4 microns.

In some embodiments, the final superconducting layer is desirably a film of the oxide complex containing rare earth:barium:copper (REBCO), in a stoichiometric ratio of 1:2:3 and an oxygen stoichiometry slightly deficient in oxygen. These complexes have the chemical formula "rare-earth"$Ba_2Cu_3O_{7-\delta}$, where "rare earth" includes yttrium, praesodium, neodymium, samarium, europium, gadolinium, terbium, dysprosium, holmium, erbium, thulium, ytterbium, lutetium, lanthanum and cerium. Such complexes include $YBa_2Cu_3O_{6.8}$, also known as YBCO. The extent of oxygen deficiency (that is, the amount that the stoichiometry of oxygen in such complexes is less than 7) is somewhat variable, but can range from about 6.5 to about 6.9.

If the superconducting layer is of the REBCO type, the precursor composition can contain a rare earth element, barium, and copper in the form of their oxides; halides such as fluorides, chlorides, bromides and iodides; carboxylates and alcoholates, for example, acetates, including trihaloacetates such as trifluroracetates, formates, oxalates, lactates, oxyfluorides, propylates, citrates, and acetylacetonates, and, chlorates and nitrates. The precursor composition can include any combination of such elements (rare earth element, barium, and copper) in their various forms, which can convert to an intermediate containing a barium halide, plus rare earth oxyfluoride and copper(oxyfluoride) without a separate decomposition step or with a decomposition step that is substantially shorter than that which may be required for precursors in which all constituents are solubilized, and without substantial formation of $BaCO_3$, and which can subsequently be treated using high temperature reaction processes to yield an epitaxial REBCO film with $T_c$ of no less than about 89K, and $J_c$ greater than about 500,000 A/cm$^2$ at a film thickness of 1 micron or greater. For example, for a $YBa_2Cu_3O_{6.8}$ superconducting layer, the precursor composition could contain barium halide (for example, barium fluoride), yttrium oxide (for example, $Y_2O_3$), and copper oxide; or yttrium oxide, barium trifluoroacetate in a trifluoroacetate/methanol solution, and a mixture of copper oxide and copper trifluoroacetate in trifluoroacetate/methanol. Alternatively, the precursor composition could contain Ba-trifluoroacetate, $Y_2O_3$, and CuO. Alternatively, the precursor composition could contain barium trifluoroacetate and yttrium trifluoroacetate in methanol, and CuO. Alternatively, the precursor composition could contain $BaF_2$ and yttrium acetate and CuO. In some preferred embodiments, barium-containing particles are present as $BaF_2$ particles, or barium acetate. It is believed to be undesirable to allow the formation of barium carbonate during processing of the superconductive layer. In some embodiments the precursor could be substantially a solublized metalorganic salt containing some or all of the cation constituents, provided at least a portion of one of the compounds containing cation constituents present in solid form.

In certain embodiments, the precursor in a dispersion includes a binder. The binder functions to hold the fine particles together as an aid in deposition on the underlying layer. Suitable binders include cellulose derivatives such as nitrocellulose, methylcellulose, hydroxyethylcellulose, carboxymethylcellulose and other cellulose derivatives known in the art. Also useful are polymeric binders and copolymeric binders such as polyvinyl binders and copolyvinyl binders including polyvinyl aldehydes and copolyvinyl aldehydes such as polyvinyl butyral polymers and copolymers. Other binders include various starches from various sources, and chemically modified starches.

Dispersants can also be included in certain embodiments. A wide variety of dispersants can be utilized in particular embodiments. For example, any organic solvents which do not solublize all precursor constituents can be used. For example, sorbitan esters, sorbitan diesters and sorbitan triesters, including sorbitan trioleate are suitable. Further suitable dispersants can readily be chosen by those of skill in the art. Dispersions can be maintained mechanically by stirring, shaking, mixing or by ultrasonic agitation.

Solvents can also be included in certain embodiments, particularly those in which a precursor composition includes a constituent salt or compound dissolved in a solvent, in addition to constituents present as ultrafine particles in a dispersion. Solvents can be any which serve to solublize a precursor constituent. For example, common volatile organic solvents including ethers such as ethyl ether, dioxane and tetrahydrofuran; esters including alkyl acetates, alkyl propionates and alkyl formates, alcohols including straight chain and branched alkanols, and other solvents such as dimethylformamide, dimethylsulfoxide and acetonitrile can be used. Other suitable solvents can readily be put to use by those of skill in the art.

The precursor compositions can be applied to substrate or buffer-treated substrates by a number of methods, which are designed to produce coatings of substantially homogeneous thickness. For example, the precursor compositions can be applied using spin coating, slot coating, gravure coating, dip coating, tape casting, or spraying.

The invention will be further described in the following examples, which do not limit the scope of the invention described in the claims.

EXAMPLES

Starting Materials Properties

Barium acetate was purchased from Alfa Aesar (Ward Hill, Mass.) as crystalline particles, 99.0 to 102.0% (assay), stock number 12198. Trifluoracetic acid was purchased from Alfa Aesar, stock number 31771. Semiconductor grade methanol was purchased from Alfa Aesar, stock number 19393. 1% and 10% solutions of nitrocellulose in amyl acetate were purchased from Ernest Fullham, Inc.

Yttrium oxide was purchased from Nanophase Technologies Corp. (Burr Ridge, Ill.), as 99.5% purity (total rare earth oxide) particles, product code 1600. The manufacturer's stated average particle size was 17–30 nm, as determined by BET analysis of specific surface area. Barium fluoride was purchased from Alfa Aesar as 99% pure (assay) particles, with less than 40 mesh particle size, stock number 12338. To reduce particle size, the as-received barium fluoride was jet-milled to a best-effort particle size reduction by Jet Pulverizer Co. (Palmyra, N.J.). Copper oxide particles were purchased from Nanophase Technologies, Inc. as 99.5+% pure particles, product code 0500. The manufacturer's stated average particle size was 16–32 nm, as determined by BET analysis of the specific surface area.

The $Y_2O_3$ and CuO particles were investigated by transmission electron microscopy. The as-received particles were typically spherical, individually less than about 50 nm in diameter, and bridged into networks. Barium fluoride was investigated by scanning electron microscopy before and after jet-milling. Before milling, the particles appeared blocky and smaller than the 40 mesh size specified by the manufacturer. The jet-milled particles appeared more uniform in size and were less blocky.

Purity of materials was investigated by inductively coupled plasma/atomic emission spectroscopy (ICP/AES). The nanophase $Y_2O_3$ was assayed as 91% pure, $BaF_2$ as 88% pure and CuO as 99.4% pure. These materials were also examined for the presence of common impurities, which are shown in Table 1. These materials were not baked prior to analysis, and the major contaminant in $Y_2O_3$ and $BaF_2$ was presumed to be moisture. Jet-milling did not appear to introduce additional contaminants.

agglomerates. A dry aerosol time-of-flight method was used, and Nanophase Technologies, Inc. dispersed the particles in a liquid that was ultrasonically agitated during the measurement. The inventors' analysis is likely indicative of agglomerate and individual particles. Jet-milling of $BaF_2$ successfully resulted in reduction of particle size, as well as tightening the size distribution.

Example 2

Demonstration of Epitaxial Film Growth

Three precursor slurries were prepared, as summarized in Table 3. Two of the precursors were prepared by dispersing $Y_2O_3$ and CuO into Ba-trifluoroacetate (Ba-TFA) dissolved in methanol, with differences in the amount of methanol used. The Ba-TFA was made by dissolving barium acetate in water, then adding trifluoroacetic acid. The trifluoroacetic acid replaced the acetate group on the barium. The aqueous Ba-TFA solution was then vacuum dried, and the Ba-TFA obtained from the drying operation was dissolved in methanol. A third dispersion was made by dispersing $Y_2O_3$, $BaF_2$, and CuO in a 3% solution of nitrocellulose in amyl acetate. The yttrium molarity was calculated as (moles Y)/(volume of solution+volume of solids in dispersion). The stoichiometry of these precursors, determined by ICP/AES, is presented in Table 4.

TABLE 1

Impurities present in Raw Materials (wt. %)

| Material | Al | Ca | Cl | Fe | K | Na | S | Si | Sr | Ti | Zn | heavy metals |
|---|---|---|---|---|---|---|---|---|---|---|---|---|
| $Y_2O_3$ | 0.013 | 0.043 | | 0.008 | | NPD | 0.020 | 0.001 | NPD | NPD | NPD | |
| CuO | NPD | NPD | | NPD | | NPD | NPD | NPD | NPD | 0.003 | 0.080 | |
| $BaF_2$ (as received) | 0.229 | | | 0.012 | | 0.442 | | 3.63 | 1.06 | | | |
| $BaF_2$ (milled) | 0.231 | | | NPD | | 0.438 | | 3.94 | 1.05 | | | |
| $Ba(CO_2CH_3)_2$ | | 0.007 | 0.0006 | 0.0004 | 0.03 | 0.002 | | | 0.07 | | | 0.0004 |

The Θ-2Θ X-ray diffraction (XRD) pattern of the as-received $Y_2O_3$ matched the monoclinic phase of this material. The XRD patterns for $BaF_2$ before and after milling matched the pattern for frankdicksonite, which is a cubic pattern. The XRD pattern of the as-received CuO matched the pattern for the monoclinic (tenorite) phase of this material.

The results of the particle size measurements of $Y_2O_3$, $BaF_2$ and CuO particles are presented in Table 2.

TABLE 2

Particle Size Measurements (microns)

| | Particle size as measured by inventors (time-of-flight) | | Particle size as measured by manufacturer (agitation) | |
|---|---|---|---|---|
| Material | mean | Std. Dev. | Mean | Std. dev. |
| $Y_2O_3$ | 0.64 | 1.83 | 0.21 | 0.17 |
| CuO | 0.46 | 1.88 | 0.13 | 0.041 |
| $BaF_2$ (as received) | 1.3 | 1.77 | — | — |
| $BaF_2$ (milled) | 0.78 | 1.42 | — | — |

Differences in the sizes of $Y_2O_3$ and CuO particles as measured by Nanophase Technologies, Inc. and our measurements are likely due to differences in the methods used and the effectiveness of each method at breaking up loose

TABLE 3

Precursor Description

| dispersion | Y source | Ba source | Cu source | Dispersing liquid | Y molarity |
|---|---|---|---|---|---|
| A | $Y_2O_3$ | Ba-TFA | CuO | MeOH | ~0.37 |
| B | $Y_2O_3$ | Ba-TFA | CuO | MeOH | 0.64 |
| C | $Y_2O_3$ | $BaF_2$ | CuO | 3% nitrocellulose/ amyl acetate | 0.50 |

TABLE 4

Stoichiometry of Precursor Materials determined by ICP/AES

| | Molar ratio (normalized to Y = 1) | | |
|---|---|---|---|
| Dispersion | Y | Ba | Cu |
| A | 1 | 1.99 | 2.95 |
| B | 1 | 1.91 | 2.96 |
| C | 1 | 1.80 | 3.02 |

Comparison of superconducting films was made between a metalorganic deposition (MOD) process, and the inventive deposition process. The MOD process employed yttrium acetate, barium acetate, and copper acetate. Each salt was dissolved in water, fluorinated with trifluoroacetic acid, and vacuum dried. The dried salts were then dissolved in methanol to produce the yttrium/barium/copper (YBC) solution for coating. Control of the precursor chemistry, and hence the stoichiometry, is very precise.

Critical current density ($J_c$) development experiments were performed on $CeO_2$-capped yttria-stabilized zirconia (CeO/YSZ) single crystals, except sample AP9 (described below), which was coated onto single crystal strontium titanate. YSZ single crystals were purchased from CrysTec GMBH (Berlin, Germany) as 10×10×0.5 mm wafers with a (100) normal orientation, one side polished to $R_a$=0.179 nm. 20 nm of cerium oxide was sputter deposited on the surface of these wafers, then post-annealed in an oxygen atmosphere for one hour at 950° C. The CeO/YSZ system was chosen because these are the materials typically employed as the top two buffer layers in development of coated conductor articles. Table 5 provides a summary of the samples that were fully processed and measured electrically. Samples which were processed for development of coating and decomposition cycles but not reacted or measured are not included.

Figure 10:
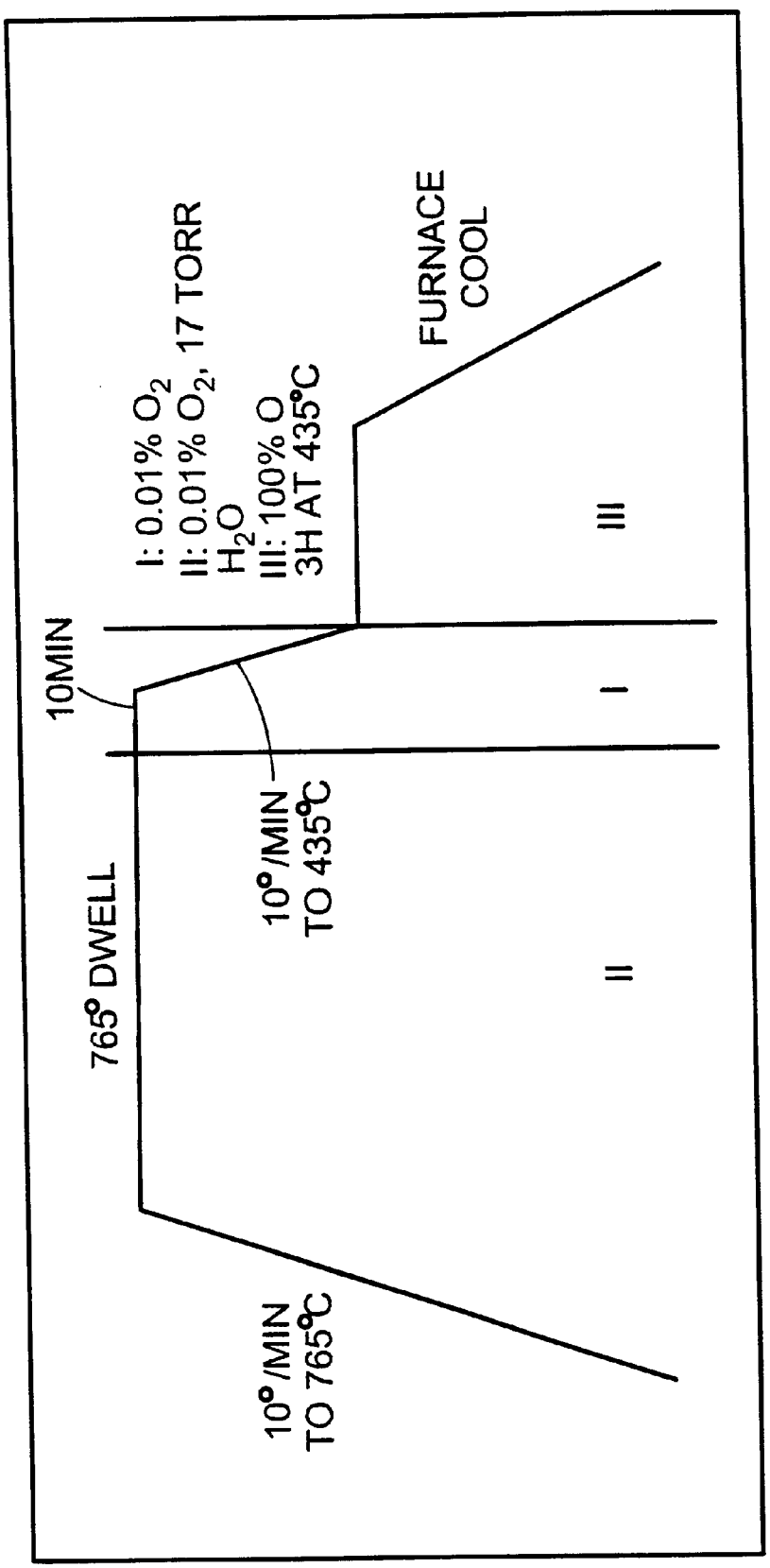
FIG. 10 is a furnace profile diagram used for reaction of samples according to particular embodiments of the invention.

The isothermal hold time at peak temperature was recorded as the reaction time. The furnace profile used for reaction of all samples, except for sample AP9, which had a 735° C. peak temperature isothermal hold, is shown in FIG. 10.

Figure 11:
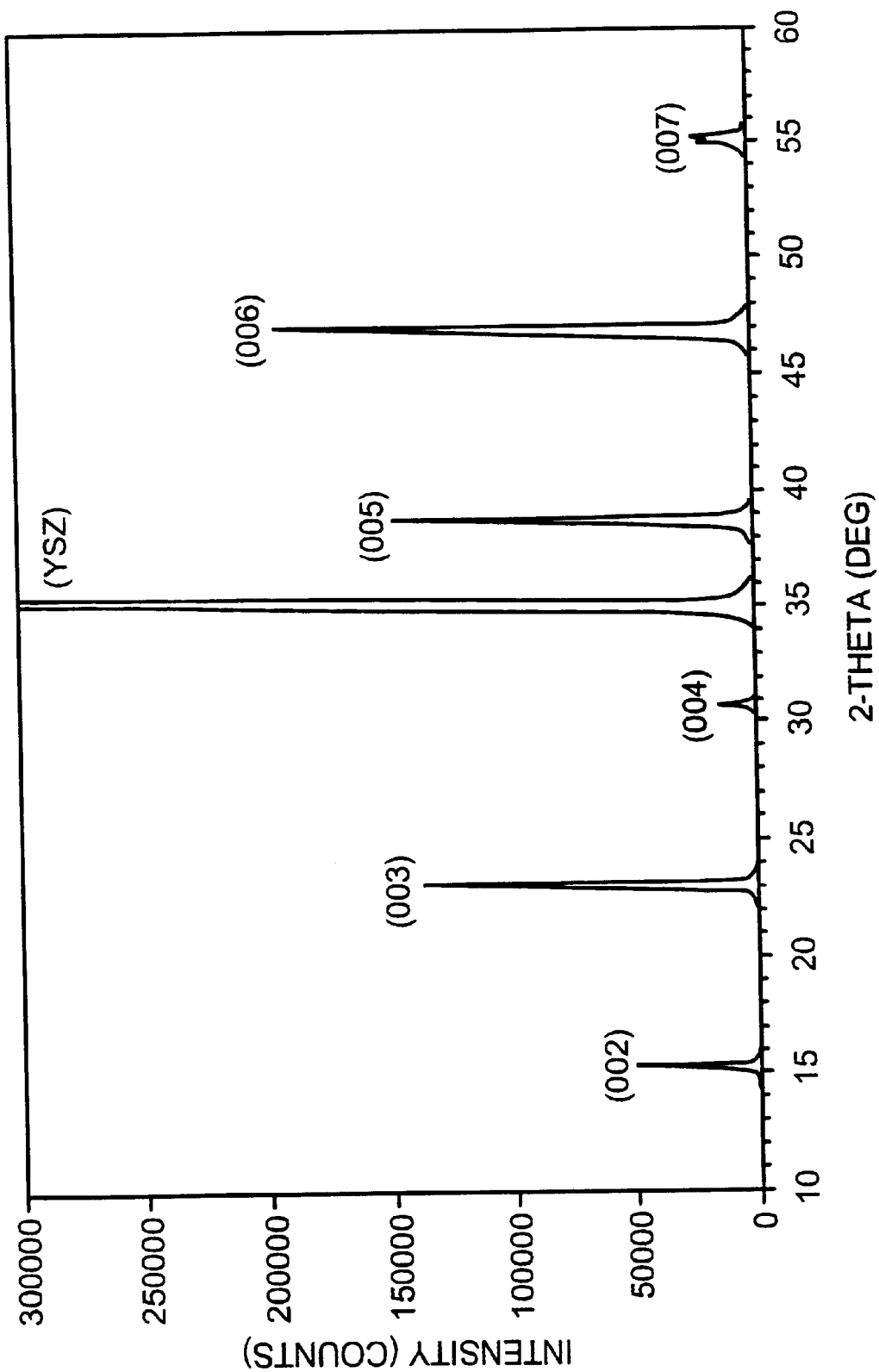
FIG. 11 is a Θ-2Θ X-ray diffraction spectrum of a sample according to a particular embodiment of the invention.
Figure 12:
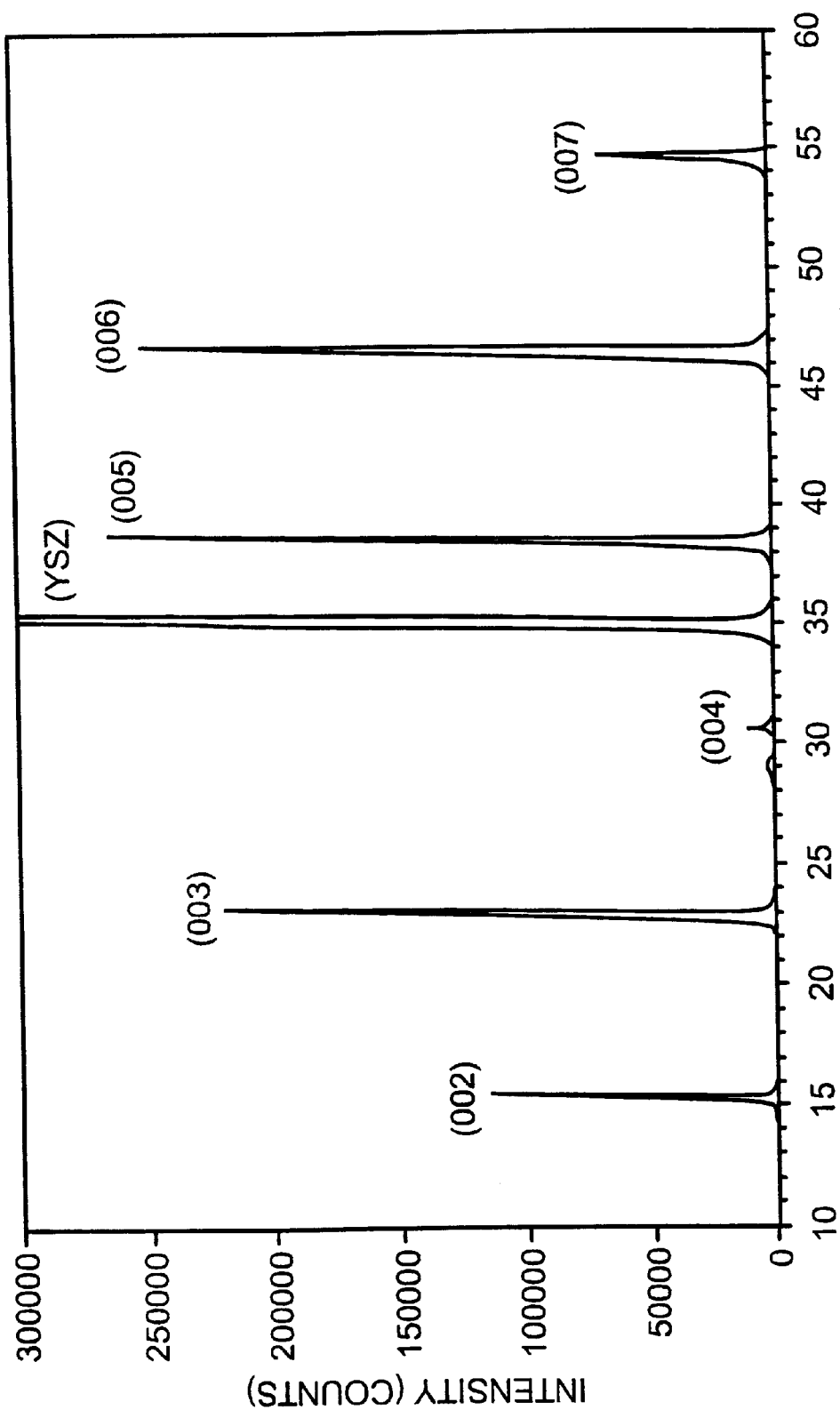
FIG. 12 is a Θ-2Θ X-ray diffraction spectrum of a prior art sample.
Figure 13:
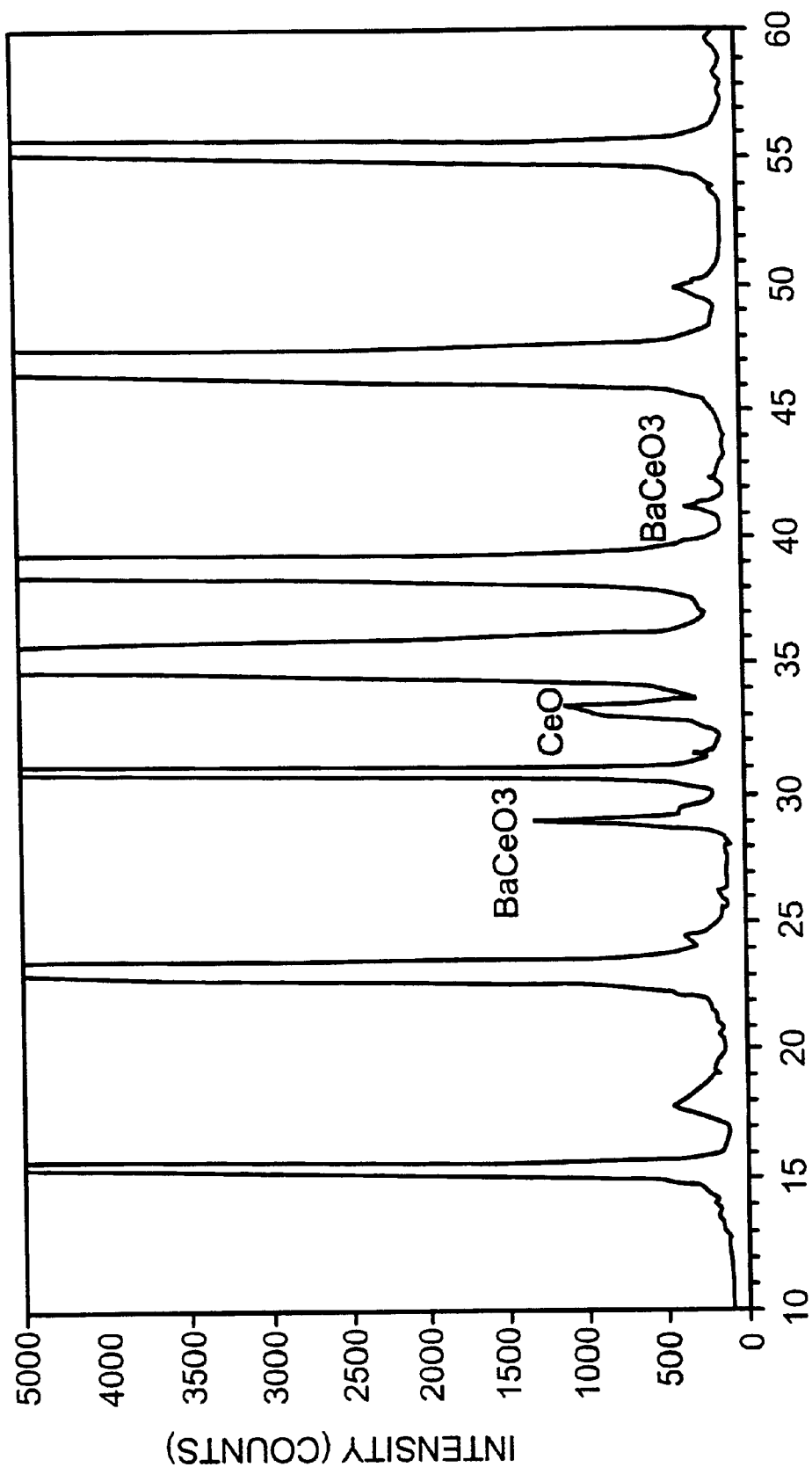
FIG. 13 is an expanded scale view of FIG. 11.
Figure 14:
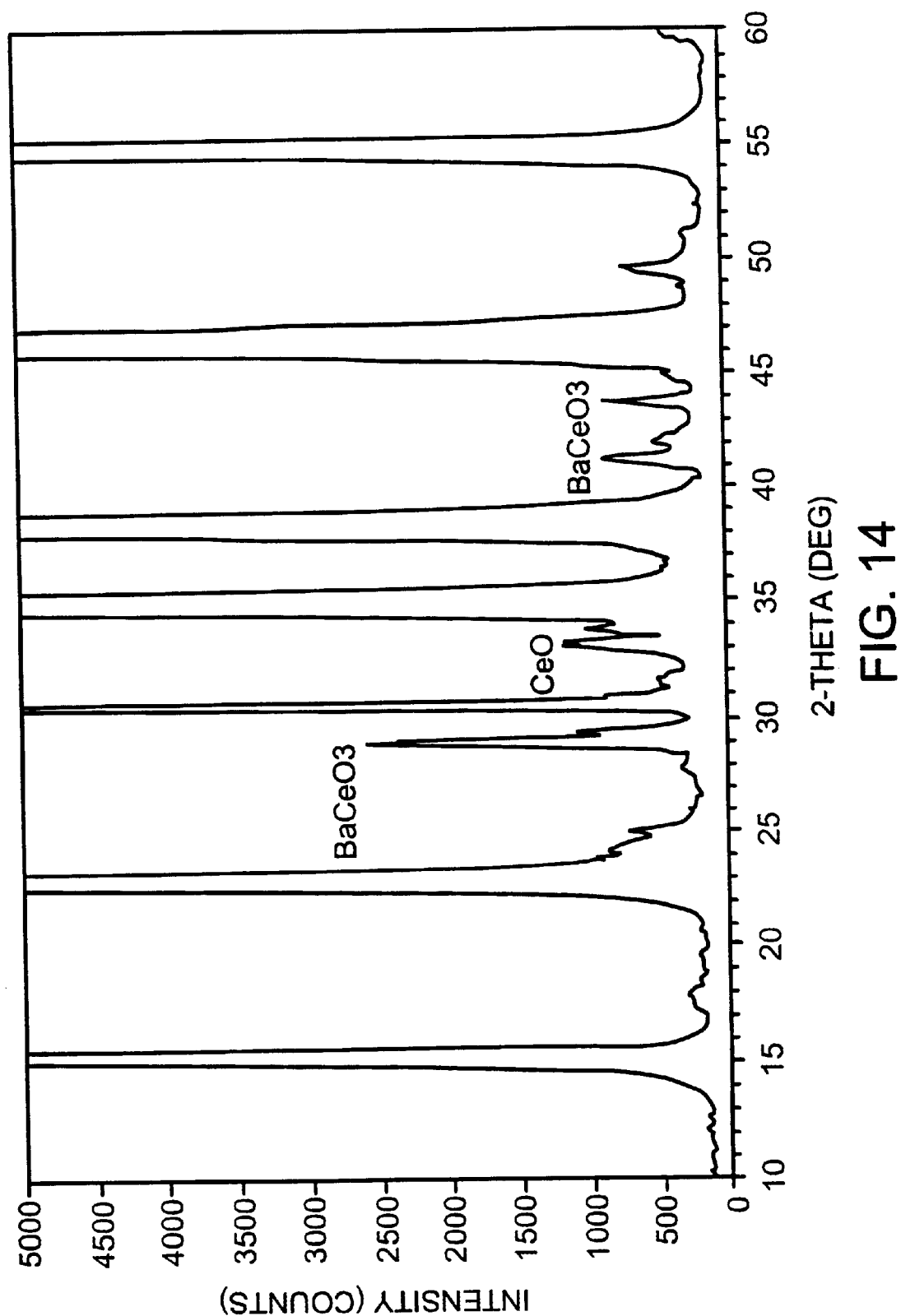
FIG. 14 is an expanded scale view of FIG. 12.

The XRD pattern of the 1.5 micrometer thick sample AP23 after reaction to form $YBa_2Cu_3O_{7-\delta}$ is shown in FIG. 1. The pattern clearly indicates c-axis texture for the fully converted YBCO film. For comparison, the XRD pattern of a baseline 1.2 μm thick MOD-coated CeO/YSZ substrate is shown in FIG. 12. FIGS. 13 and 14, respectively, show expanded scales of the scans in FIGS. 11 and 12, indicating that in both systems, a $BaCeO_3$ reaction product was formed. The phase content and c-axis texture of YBCO films formed by the two methods on CeO/YSZ were similar.

Figure 15:
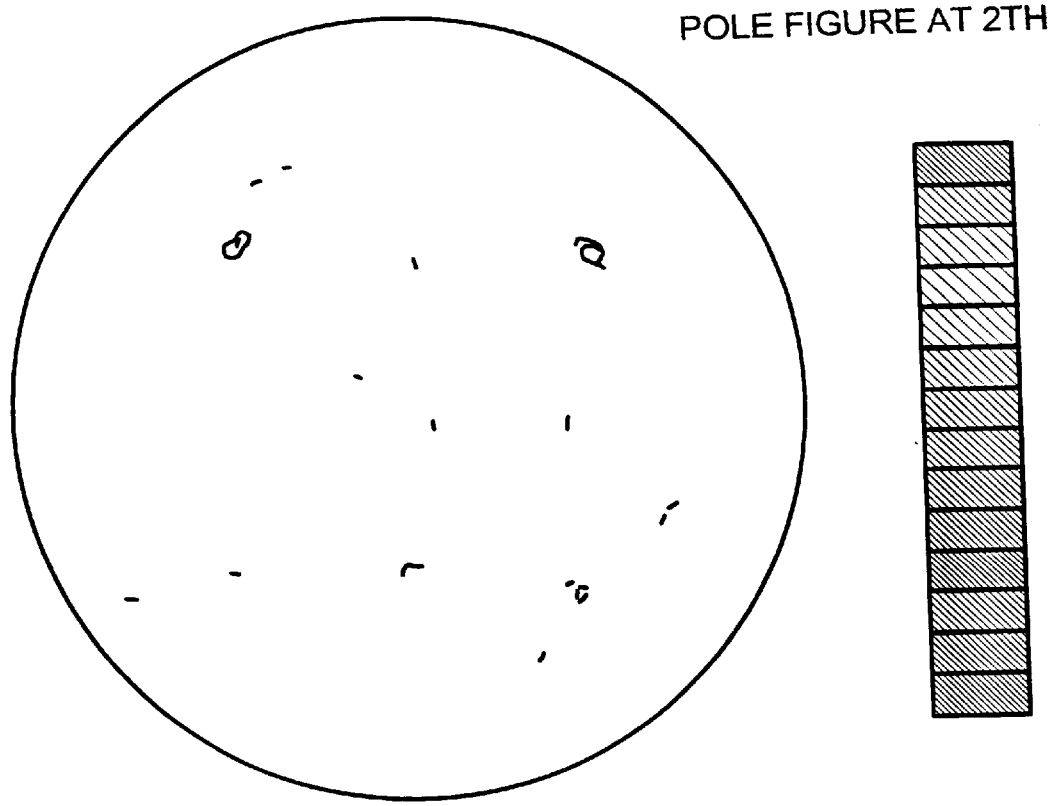
FIGS. 15–16 are pole figures for samples according to particular embodiments of the invention.
Figure 16:
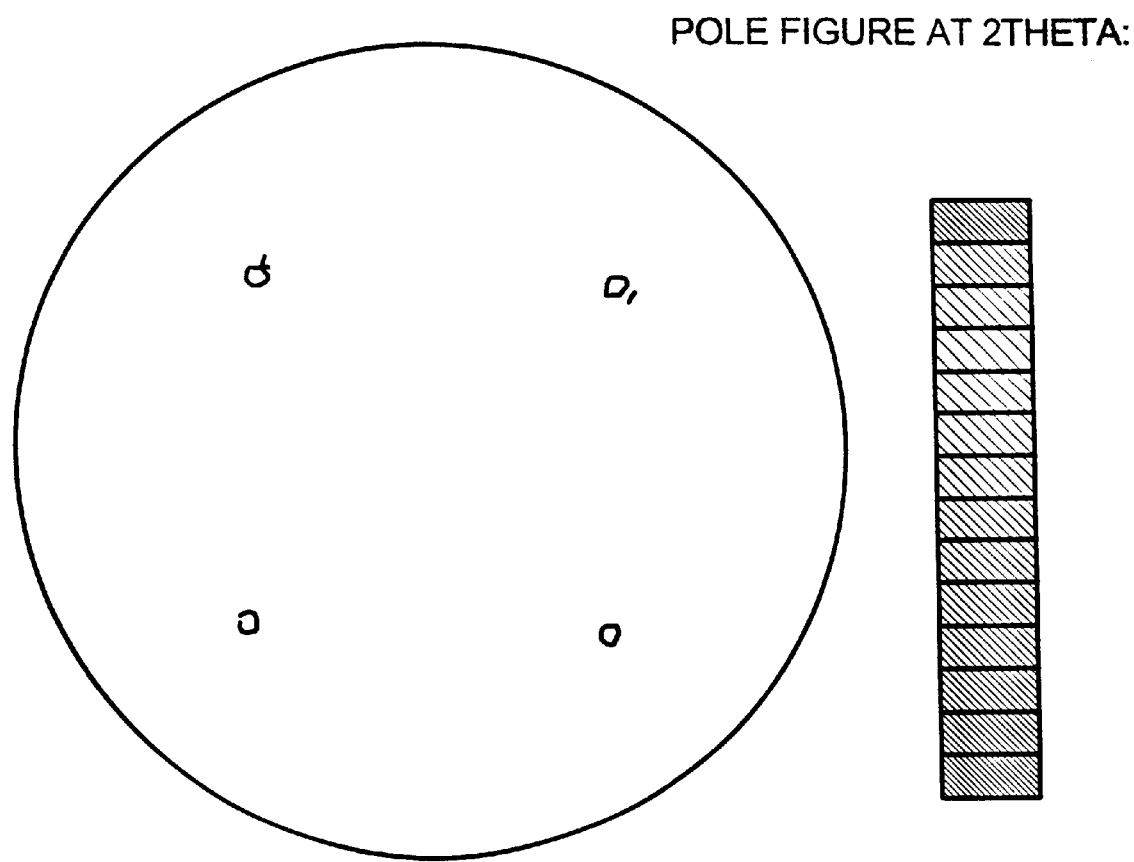
Figure 17:
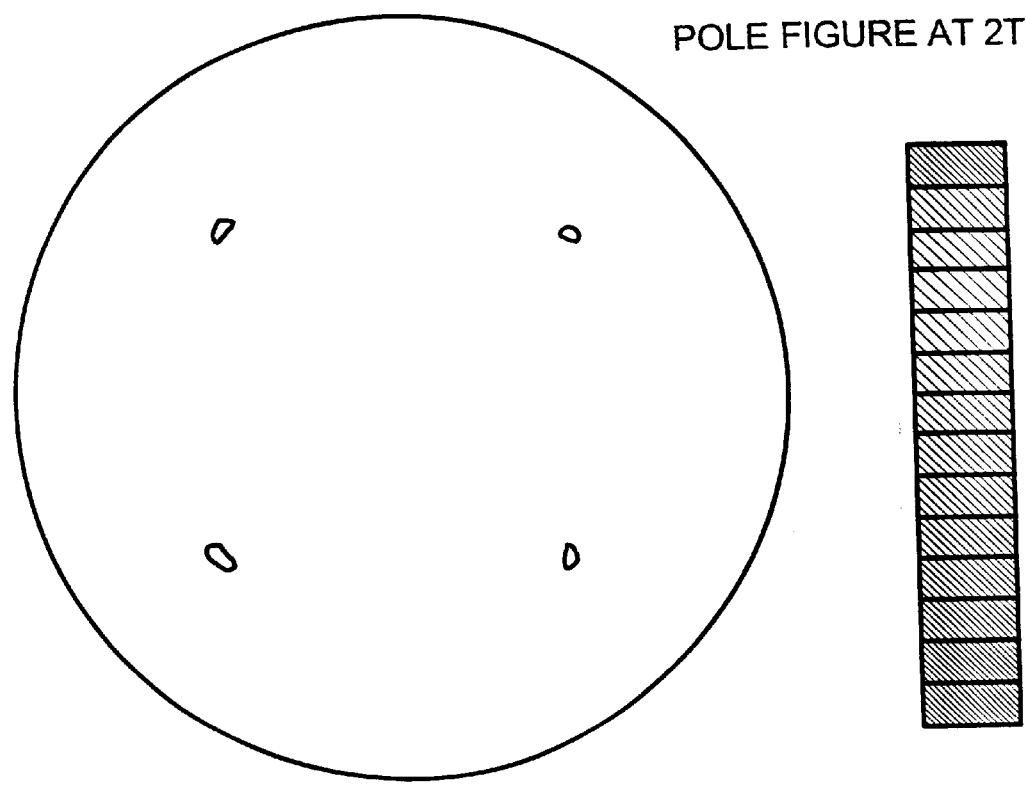
FIG. 17 is a pole figure for a prior art sample.

Pole figure analysis was performed using a dedicated Siemens X-ray system with a 2-D detector system to increase analysis speed and sensitivity. FIG. 15 shows the (102) YBCO pole figure for sample AP21, which had a relatively weak biaxial texture. FIG. 16 shows the (102) YBCO pole figure for the 0.5 micrometer thick sample AP18, which had a stronger biaxial texture. As a comparison, the pole figure analysis of a baseline 0.8 μm thick MOD-coated and reacted film is shown in FIG. 17.

TABLE 5

Precursor Reaction Conditions and Properties of Superconducting Layers

| Sample ID | Precursor | Coat method | Decomposition time (hours) | Reaction time (hours) | Final thickness (microns) | $J_C$ ($MA/cm^2$) minimum | $T_C$(K) | ΔT (K) |
|---|---|---|---|---|---|---|---|---|
| AP6 | A | Spin | 4.3 | 5 | 1.2 | 0.15 | 87.3 | 1.5 |
| AP9 | A | Spin | 0.5 | 8 | 1.2 | 0.13 | | |
| AP18 | A | Spin | 0.5 | 5 | 0.66 | 0.40 | | |
| AP19 | A | Spin | 0.5 | 5 | 0.65 | 0.28 | | |
| AP20 | A | Spin | 0.5 | 4 | 0.81 | 0.30 | | |
| AP21 | B | Spin | 0.5 | 6 | 2.6 | 0.35 | | |
| AP22 | B | Spin | 0.25 + 0.25 | 8 | 2.1 | 0.42 | 89.6 | 1.1 |
| AP23 | B | Spin | 0.25 | 4 | 1.5 | 0.50 | 89.3 | 1.4 |
| AP29 | C | Spin | 0.5 | 8 | 1.1 | 0 | 89.7 | 1.5 |
| AP30 | C | Dip | 0.5 | 8 | 3.5 | 0 | 90.1 | 1.8 |
| Baseline | MOD | Spin | 3 | 1 | 0.4 | 4.5 | 92–93 | 1–2 |
| Baseline | MOD | Spin | 3 + 3 | 2 | 0.8 | 2.5 | 92–93 | 1–2 |
| Baseline | MOD | Spin | 3 + 3 + 3 | 3 | 1.2 | 2 | 92–93 | 1–2 |
| Baseline | MOD | Spin | 3 + 3 + 3 + 3 | 3 | 1.5 | 0.6 | 92–93 | 1–2 |

Figure 5:
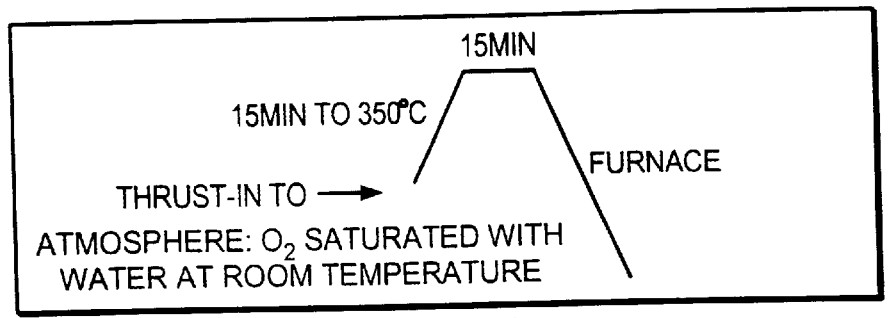
Figure 6:
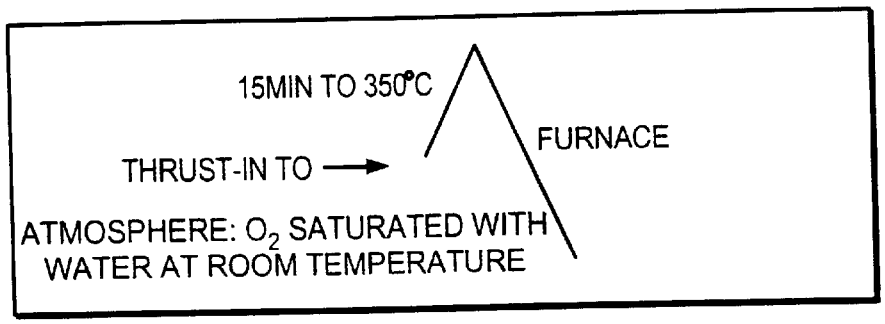
Figure 7:
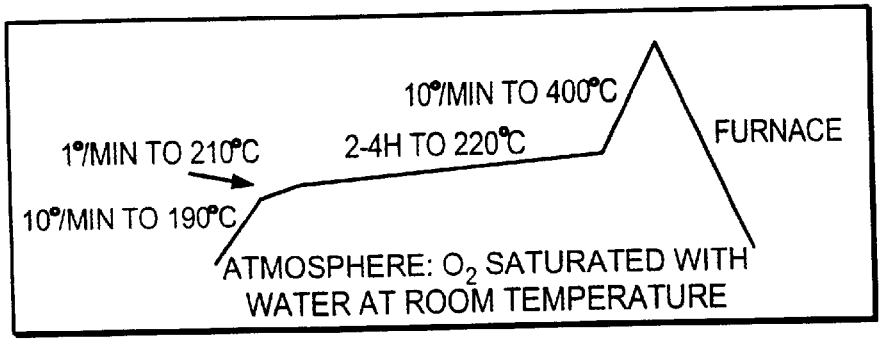
FIG. 7 is a furnace profile diagram used for decomposition of a prior art sample.

The time from first introduction to the furnace to the start of cool down was recorded as the decomposition time. The furnace profile used to decompose sample AP6 is shown in FIG. 4, the profile used for samples AP9–AP20, and for samples AP29–AP30 is shown in FIG. 5, and the profile used for samples AP22–AP23 is shown in FIG. 6. For comparison, the typical profile used for decomposing an MOD film is shown in FIG. 7. Multiple decomposition times indicated in Table 5 specify that samples were repeatedly coated and decomposed as often as necessary to achieve film thickness before reaction. Upon completion of the decomposition cycle, the samples were patterned to form bridges to enable $I_c$ measurement, with the exception of sample AP 18, which was patterned after reaction.

Figure 8:
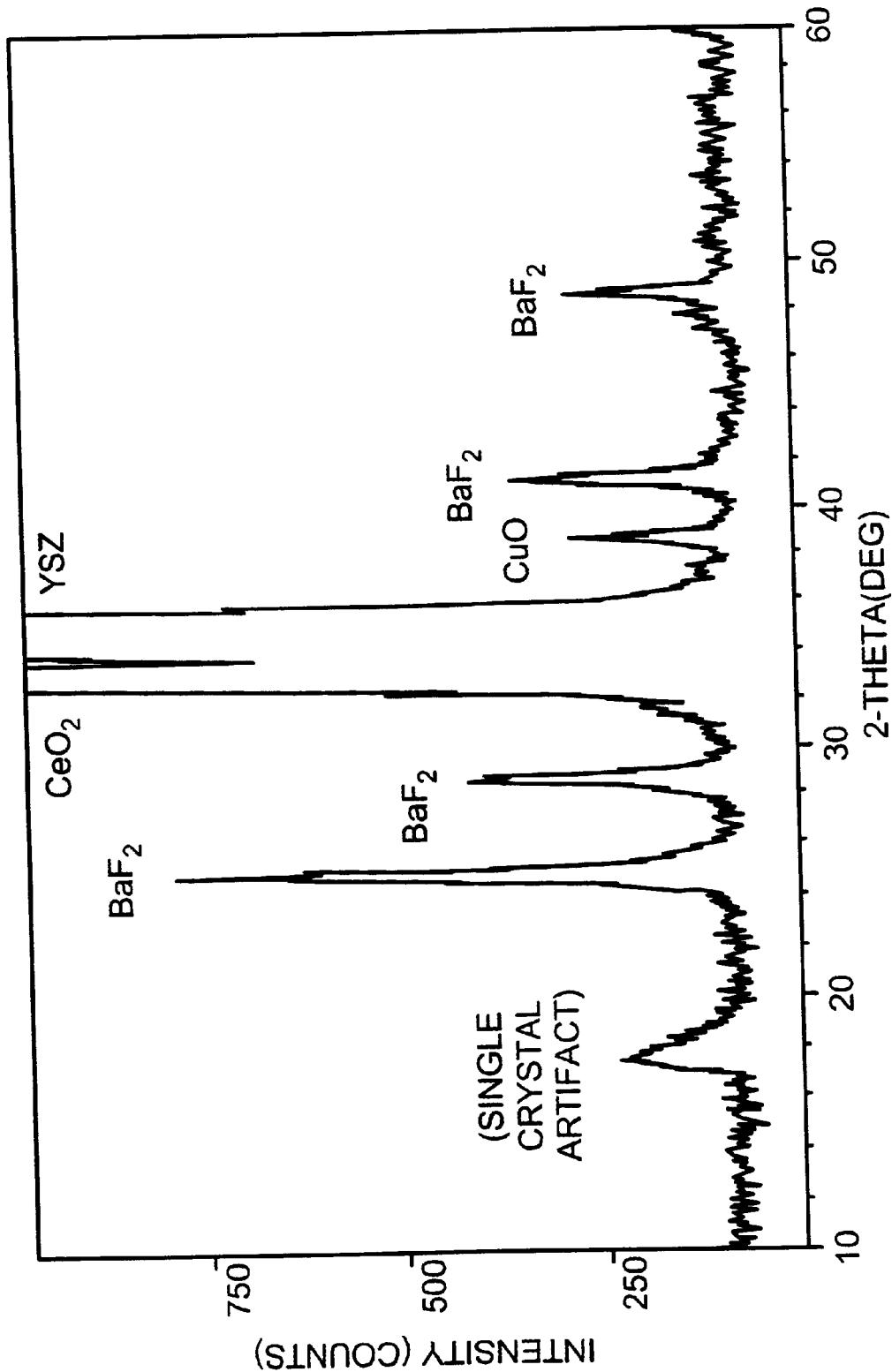
FIG. 8 is a Θ-2Θ X-ray diffraction spectrum of a sample according to a particular embodiment of the invention.
Figure 9:
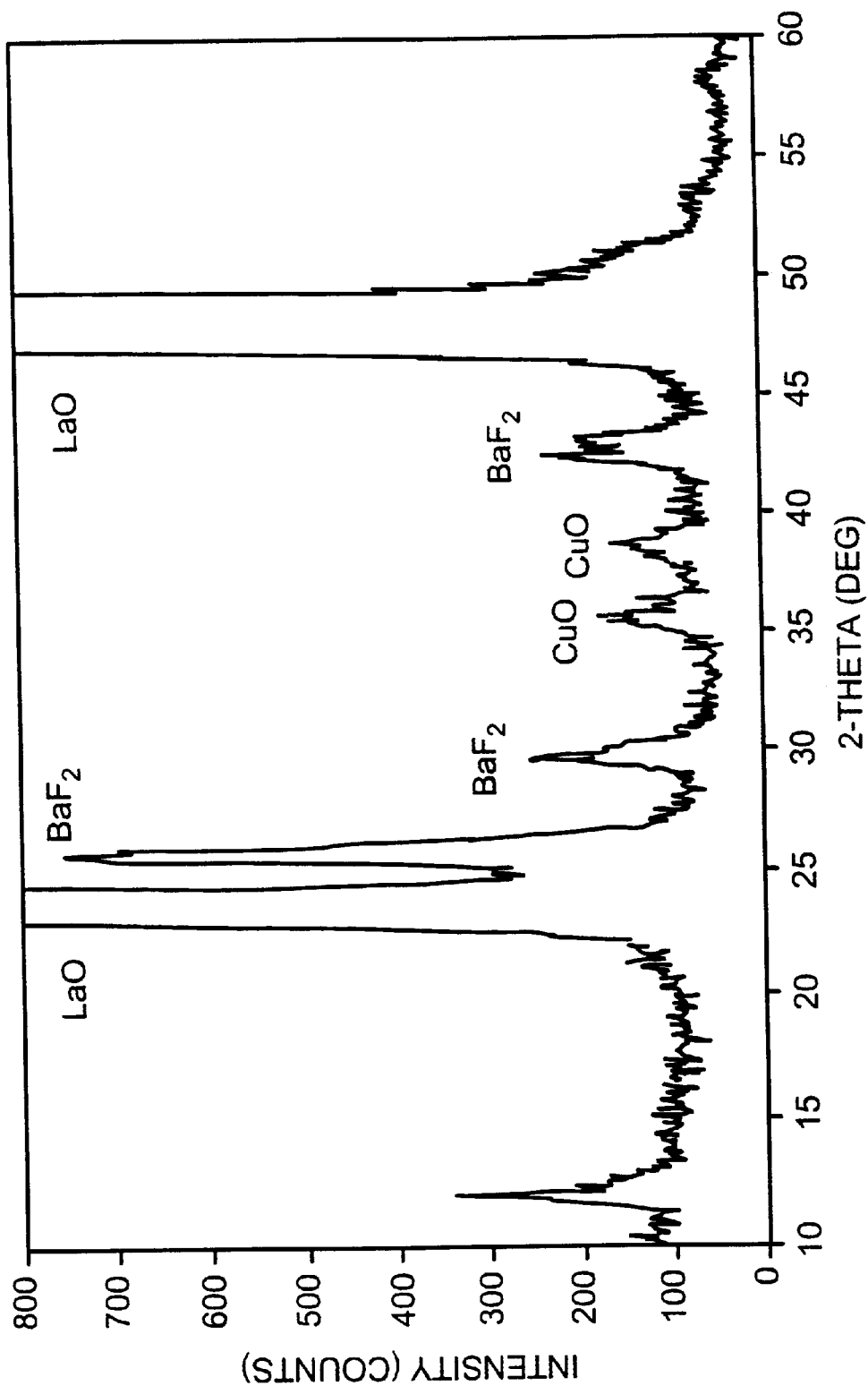
FIG. 9 is a Θ-2Θ X-ray diffraction spectrum of a prior art sample.

The XRD pattern of AP6, which was typical of all scans run on decomposed solid-state precursor-coated CeO/YSZ is shown in FIG. 8. For comparison, a typical scan of MOD-coated lanthanum aluminate is shown in FIG. 9. The $BaF_2$ peak at 24.8° in the pattern generated from the MOD-coated sample was shifted to a slightly higher angle, whereas this same peak was not shifted in the scan of the samples according to the invention.

The thickness of the films used in the measured bridge after reaction were measured by scanning the bridge depth using a white light interferometer. Some conservatism is built into the $J_c$ calculations due to such measurements. Since the film surface is relatively low density and rough, the average thickness taken from the rough surface is greater than the actual current-carrying dimension.

The surfaces of coated and reacted films were examined optically at 8×, 62×, and 500× magnification. Some surfaces were also examined by scanning electron microscopy (SEM) to gain an understanding of the general morphology of the films.

The general surface morphology of the inventive films is similar to that of the baseline MOD films, although the MOD films appear denser and perhaps smaller in "grain-"size. The sizes of the surface features are likely functions of both processing parameters (time, temperature) and thickness. It is not clear whether this surface density difference is due to the relative thickness of the samples or if it represents an inherent difference in the YBCO structures produced by the different methods.

Example 3

Characterization of Superconducting Film Properties

Bridges were patterned on the samples after decomposition by physically scribing parallel lines to define the bridge. Silver pads were deposited onto the fully converted film surface using thermal evaporation to provide for current input and voltage taps. Samples were immersed in liquid nitrogen and critical current density ($I_c$) measured using the standard four-point measurement technique and a 1 μvolt/cm criterion. This method is known to those of skill in the art. To calculate $J_c$, the $I_c$ was divided by the average measured thickness and the width of each bridge as determined from optical analysis. Transport transition temperatures ($T_c$) were measured by cooling the samples in helium vapor across their transition temperature. $J_c$ and $I_c$ results are shown above in Table 5.

Samples made from precursors A and B delivered $J_c$ in the range from 0.13 to 0.50 MA/cm² in thicknesses ranging from 0.65 to 2.6 μm. The samples made from precursor C exhibited superconducting transition, but the $J_c$ were virtually zero. The high level of impurities in the $BaF_2$ component of this precursor might have been a likely cause contributing to the poor current carrying performance of these samples.

$T_{c^o}$ values for these inventive samples ranged from 87.3 to 90.1, with $\Delta T_c$ values ranging from 1.1–1.8 K. For comparison, typical $T_{c^o}$ values in baseline MOD films are 90–92 K, with $\Delta T_c$ values of 1–2°. These results show that the inventive method can produce thick superconducting films of performance equal to the baseline MOD process, especially for film thickness above about 1.5 microns.

Example 4

Long Length Coating Process

To evaluate long length coating behavior, precursor B was web coated onto a fine silver strip. The silver strip was purchased from Cimini and Associates, Inc. (Pawcatuck, Conn.) and was 3 meters long, 1 inch wide×0.003 inches thick, and was in the half hard condition.

Precursor B was applied to the silver as a 18.2 μm thick layer, which corresponds to a 1.5 μm final reacted YBCO layer thickness. A syringe pump delivered the precursor at 0.77 ml/min into a 14 mm wide stainless steel slot die applicator, which had a 0.004 inch slot height. The precursor was agitated in an ultrasonic bath before fluid was drawn into the syringe, and approximately four minutes elapsed before the beginning region of the 3 m length was coated. The gap between the applicator and the web was 0.005 inches, and line speed was 3 meter/min. Approximately 3 m of silver was coated and allowed to air-dry before being wrapped into a coil.

Figure 18:
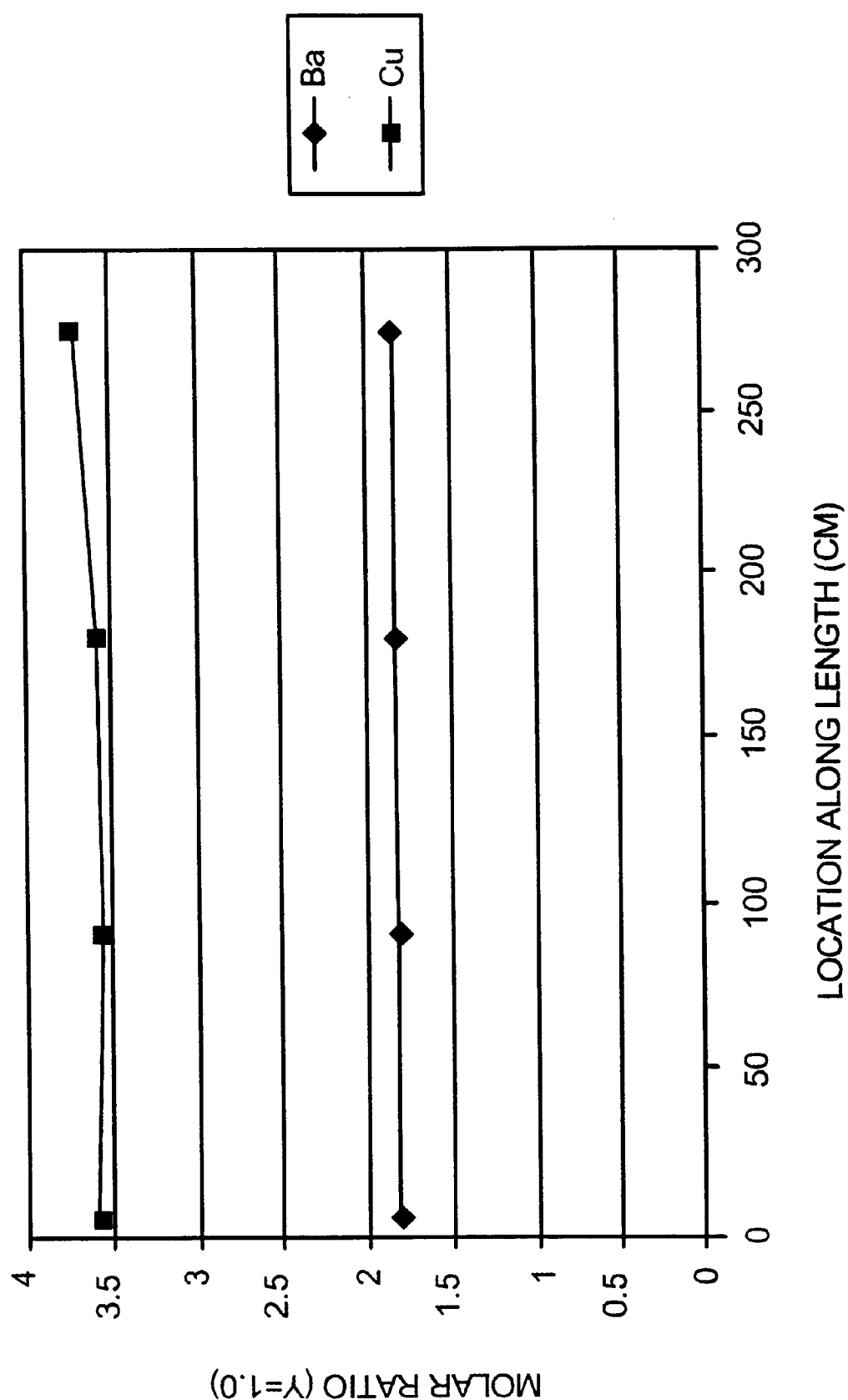
FIG. 18 is a plot of elemental molar ratios taken at different locations on a sample tape according to a particular embodiment of the invention.

Four 10 cm length pieces were cut at intervals along the length and digested entirely in 10% $HNO_3$ for ICP/AES analysis to determine compositional drift over the length of the 3 meter coating. The Y—Ba—Cu molar ratios from these samples are plotted in FIG. 18. The data indicate that the Ba/Y ratio stayed roughly constant over the length of the tape. Such measurement can also be carried out by other techniques, for example, by Auger spectroscopy, by diffuse infrared Fourier transform spectroscopy, or by energy dispersive analysis by X-ray.

Figure 19:
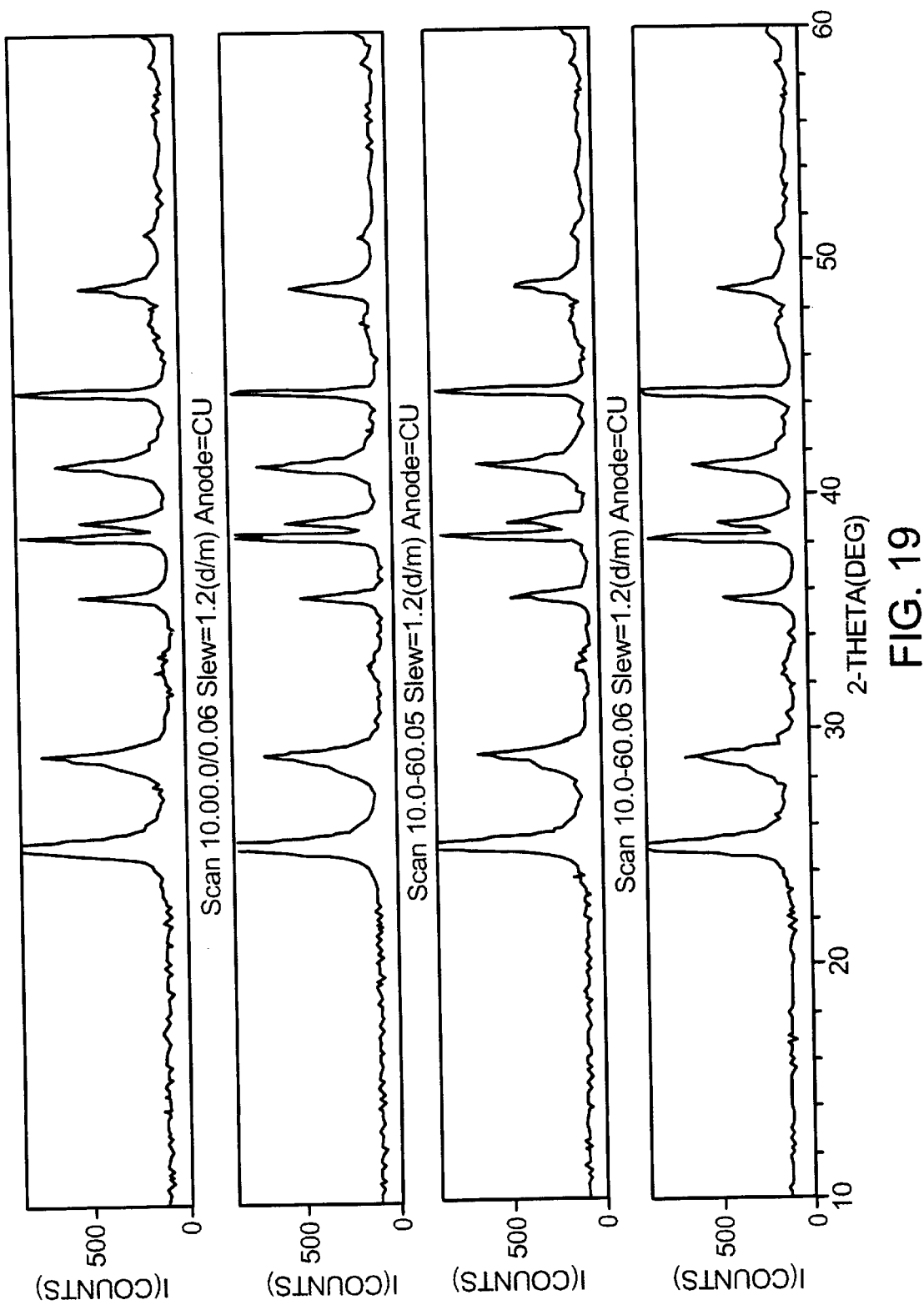
FIG. 19 is a Θ-2Θ X-ray diffraction spectrum of decomposed samples according to particular embodiments of the invention.
Figure 20:
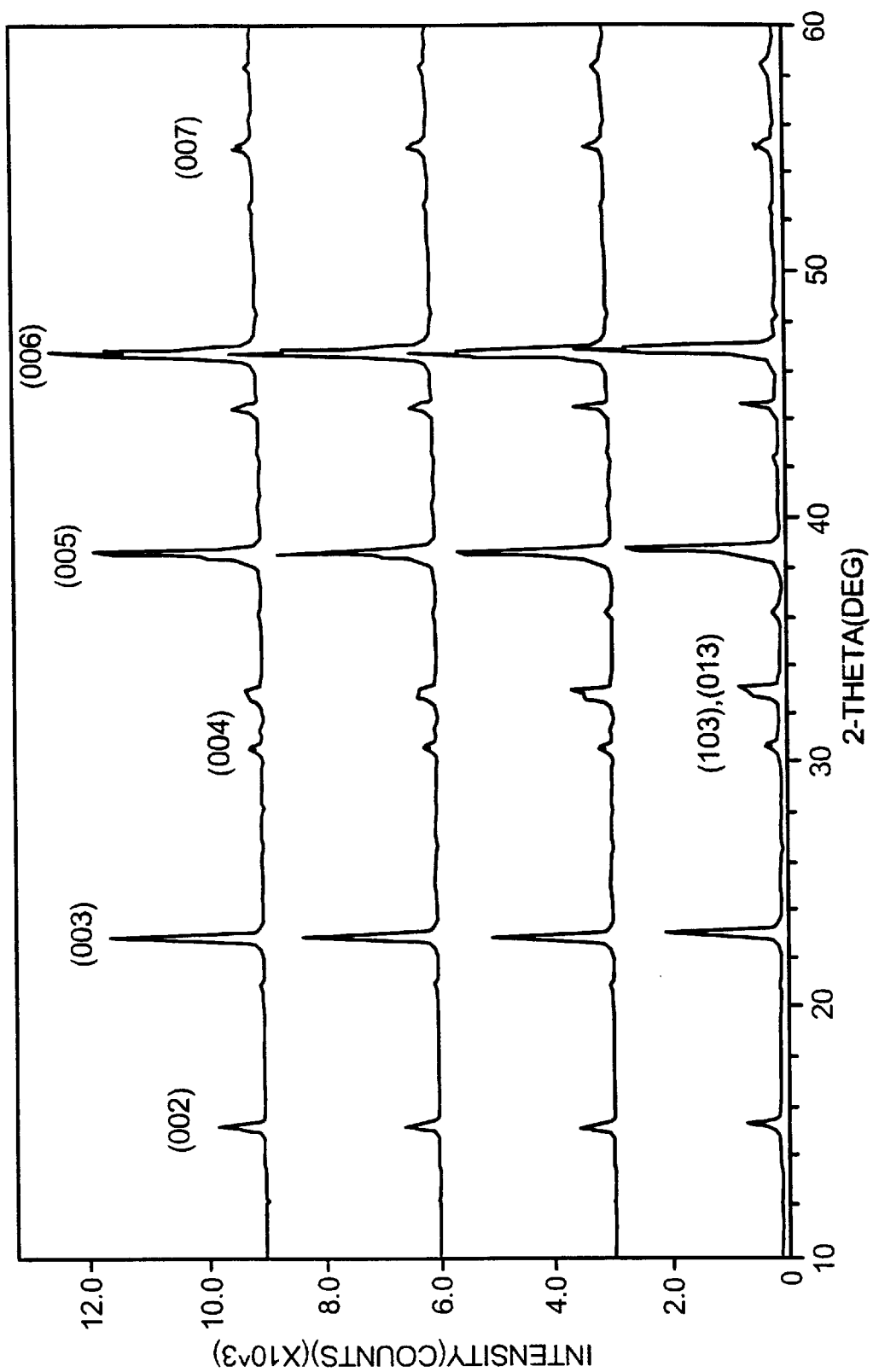
FIG. 20 is a Θ-2Θ X-ray diffraction spectrum of reacted samples according to particular embodiments of the invention.

Samples cut from 12, 98, 173 and 267 cm along the length of the tape were decomposed per the cycle shown in FIG. 5. XRD patterns of these decomposed samples are shown in FIG. 19. No differences were apparent in their phase content. These samples were then reacted for 7 hours according to the thermal profile of FIG. 10. The XRD patterns of the reacted samples are shown in FIG. 20.

The results presented herein indicate that the $J_c$ obtained for the inventive method of preparing superconducting layers are already on the order of 25–50% of the highest $J_c$ obtained for YBCO films of comparable thickness below about 1 micron derived from optimized metalorganic solution processes. The performance of films produced by the inventive processes is comparable to that of the films produced by the baseline MOD process under the same growth conditions, for films with thicknesses greater than about 1.5 micrometers. The inventive process also eliminates the complex decomposition thermal cycle without producing any of the known defects (i.e. cracks, blisters, dewetting) of the MOD processes. These results indicate no fundamental limitation to performance of the solid-state derived precursor films, and significant improvement in economics and process robustness. The precursors could be converted to biaxially textured YBCO films with no strong evidence of second phase formation, even for precursors that were not strictly stoichiometric.

It will be apparent to one of skill in the art that the reaction conditions specifically disclosed herein can be further optimized according to routine experimentation. It is, for example, well known that YBCO reaction processes, and resulting film structure and properties, are strongly affected by such variables as temperature, water and oxygen content in the reaction gas, and gas dynamics within the furnace.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A precursor composition in the form of a dispersion that includes particles of at least one precursor constituent; and a dispersant containing the particles, wherein the dispersion is capable of being disposed on a surface and processed to form a barium halide-containing intermediate of a superconductive film disposed on the surface, and said particles comprise yttrium oxide, barium, and copper oxide.

2. The precursor composition of claim 1, wherein said particles have diameters of less than about 500 nm.

3. The precursor composition of claim 2, wherein said particles have diameters of less than about 250 nm.

4. The precursor composition of claim 3, wherein said particles have diameters of less than about 50 nm.

5. The precursor composition of claim 1, wherein said particles comprise a rare earth element, barium, and copper.

6. The precursor composition of claim 5, wherein said rare earth element, barium, and copper are present in an elemental ratio of substantially 1:2:3, respectively.

7. The precursor composition of claim 6, wherein said precursor comprises: particles comprising a rare earth element; particles comprising barium; and particles comprising copper.

8. The precursor composition of claim 7, wherein said rare earth element is in a compound in the form of a rare earth oxide, a rare earth halide, or a rare earth nitride.

9. The precursor composition of claim 7, wherein said barium is in a compound in the form of a barium halide, or barium halocarboxylate.

10. The precursor composition of claim 7, wherein said copper is in a compound in the form of a copper oxide, copper halide, or elemental copper.

11. The precursor composition of claim 5, wherein said rare earth element is yttrium.

12. The precursor composition of claim 1, wherein said particles further comprise barium halide or barium halocarboxylate.

13. The precursor composition of claim 12, wherein said barium halocarboxylate is barium trifluoroacetate.

14. The precursor composition of claim 1, wherein said barium is in the form of a compound which is convertible to a barium halide.

15. The precursor composition of claim 1, wherein at least one precursor constituent is solublized.

16. The precursor composition of claim 15, wherein said solubilized constituent is barium trifluoroacetate.

17. The precursor composition of claim 15, wherein said solubilized constituent is yttrium trifluoroacetate.

18. The precursor composition of claim 15, wherein said solubilized constituent is copper trifluoroacetate.

19. The precursor composition of claim 15, wherein said solubilized constituents are barium trifluoroacetate, and yttrium trifluoroacetate.

20. The precursor composition of claim 15, wherein said solubilized constituent is barium trifluoroacetate, yttrium trifluoroacetate, and copper trifluoroacetate, wherein a portion of said copper constituent is not solubilized.

21. A precursor composition, comprising:
   copper oxide particles; and
   a dispersant containing the copper oxide particles,
   wherein the precursor composition is in the form of a dispersion that is capable of being disposed on a surface and processed to form a barium halide-containing intermediate of a superconductive film disposed on the surface.

22. The precursor composition of claim 21, wherein the particles have diameters of less than about 500 nm.

23. The precursor composition of claim 21, wherein the particles have diameters of less than about 250 nm.

24. The precursor composition of claim 21, wherein the particles have diameters of less than about 50 nm.

25. The precursor composition of claim 21, wherein the precursor composition further comprises rare earth element particles and barium particles.

26. The precursor composition of claim 25, wherein the rare earth element particles, barium particles, and copper oxide particles are present in an elemental ratio of substantially 1:2:3, respectively.

27. The precursor composition of claim 25, wherein the rare earth element particles include particles selected from the group consisting of rare earth oxide particles, rare earth halide particles and rare earth nitride particles.

28. The precursor composition of claim 25, wherein the barium particles include particles selected from the group consisting of barium halide particles and barium halocarboxylate particles.

29. The precursor composition of claim 25, wherein the rare earth element particles include yttrium compound particles.

30. The precursor composition of claim 29, wherein the yttrium compound comprises yttrium oxide.

31. The precursor composition of claim 30, wherein the precursor composition further comprises particles selected from the group consisting of barium halide particles and barium halocarboxylate particles.

32. The precursor composition of claim 30, wherein the precursor composition further comprises barium trifluoroacetate particles.

33. The precursor composition of claim 30, wherein the precursor composition further comprises particles of a form of barium that is convertible to a barium halide.

34. The precursor composition of claim 21, wherein the precursor composition comprises at least one solubilized precursor constituent.

35. The precursor composition of claim 34, wherein the at least one solubilized constituent comprises barium trifluoroacetate.

36. The precursor composition of claim 34, wherein the at least one solubilized constituent comprises yttrium trifluoroacetate.

37. The precursor composition of claim 34, wherein the at least one solubilized constituent includes solubilized barium trifluoroacetate and solubilized yttrium trifluoroacetate.

* * * * *

UNITED STATES PATENT AND TRADEMARK OFFICE
CERTIFICATE OF CORRECTION

PATENT NO. : 6,562,761 B1
DATED : May 13, 2003
INVENTOR(S) : Leslie G. Fritzemeier et al.

It is certified that error appears in the above-identified patent and that said Letters Patent is hereby corrected as shown below:

<u>Title page,</u>
Item [56], References Cited, U.S. PATENT DOCUMENTS, please add:

-- 9/617,520    7/2000    Lu et al.
  9/616,570    7/2000    Fritzemeier et al.
  9/500,718    2/2000    Malozemoff et al. --

OTHER PUBLICATIONS, please delete:

"9/617,520    7/2000    Lu et al.
9/616,570    7/2000    Fritzemeier et al.
9/500,718    2/2000    Malozemoff et al."
"McIntyre et al.," reference replace "$Ba_2Ycu_3O^{7-x}$" with -- $Ba_2Ycu_3O_{7-x}$ --
"He et al.," reference replace "τc" with -- Tc --

Signed and Sealed this

Sixth Day of January, 2004

JAMES E. ROGAN
*Director of the United States Patent and Trademark Office*